(12) United States Patent
Gudesen et al.

(10) Patent No.: US 6,833,593 B2
(45) Date of Patent: Dec. 21, 2004

(54) ELECTRODE MEANS, A METHOD FOR ITS MANUFACTURE, AN APPARATUS COMPRISING THE ELECTRODE MEANS AS WELL AS USE OF THE LATTER

(75) Inventors: Hans Gude Gudesen, Brussels (BE); Geirr I. Leistad, Sandvika (NO)

(73) Assignee: Thin Film Electronics ASA, Oslo (NO)

( * ) Notice: Subject to any disclaimer, the term of this patent is extended or adjusted under 35 U.S.C. 154(b) by 18 days.

(21) Appl. No.: 10/290,524

(22) Filed: Nov. 8, 2002

(65) Prior Publication Data

US 2003/0107085 A1 Jun. 12, 2003

Related U.S. Application Data

(60) Provisional application No. 60/333,477, filed on Nov. 28, 2001.

(30) Foreign Application Priority Data

Nov. 9, 2001 (NO) ................................................ 015509

(51) Int. Cl.$^7$ .............................................. H01L 29/76
(52) U.S. Cl. .............................. 257/385; 257/4; 257/5; 257/347; 257/359; 438/48
(58) Field of Search ............................. 257/4, 5, 347, 257/359, 385

(56) References Cited

U.S. PATENT DOCUMENTS

| | | | |
|---|---|---|---|
| 4,309,653 A | | 1/1982 | Stack et al. |
| 4,952,031 A | | 8/1990 | Tsunoda et al. |
| 5,017,515 A | | 5/1991 | Gill |
| 6,072,716 A | * | 6/2000 | Jacobson et al. |
| 6,080,655 A | | 6/2000 | Givens et al. |
| 6,117,760 A | | 9/2000 | Gardner et al. |
| 6,239,008 B1 | | 5/2001 | Yu et al. |

FOREIGN PATENT DOCUMENTS

| | | |
|---|---|---|
| EP | 0 902 465 A1 | 3/1999 |
| EP | 11 87 123 A2 | 3/2003 |
| WO | WO 98/58383 A3 | 12/1998 |
| WO | WO 03/041084 A1 | 5/2003 |

OTHER PUBLICATIONS

Notification of Transmittal of the International Preliminary Examination Report (Form PCT/IPEA/416) dated Aug. 22, 2003.
Patent Abstracts of Japan, vol. 1999, No. 7, Mar. 31, 1999 (abstract of JP 7106450A).

\* cited by examiner

*Primary Examiner*—Fetsum Abraham
(74) *Attorney, Agent, or Firm*—Birch, Stewart, Kolasch & Birch, LLP

(57) ABSTRACT

In an electrode means comprising a first and a second thin-film electrode layers (L1, L2) with electrodes (ε) in the form of parallel strip-like electrical conductors in each layer, the electrodes (ε) are provided only separated by a thin film (6) of an electrically insulating material with a thickness at most a fraction of the width of the electrodes and at least extending along the side edges thereof and forming an insulating wall (6a) therebetween. The electrode layers (L1, L2) are planarized to obtain an extremely planar surface. In an apparatus comprising one or more electrode means (EM), the electrode layers (L1, L2) of each are mutually oriented with their respective electrodes (1;2) crossing at an angle, preferably orthogonally and with a functional medium (3) provided globally in sandwich therebetween, such that a preferably passive matrix-addressable apparatus is obtained and suited for use as e.g. a matrix-addressable data processing device or matrix-addressable data storage device comprising individually addressable functional elements (5) in the form of e.g. respectively logic cells or memory cells, the fill factor thereof in the global functional medium (3) approaching unity and a maximum number of the cells in the apparatus of approximately A/f$^2$, wherein A is the area of the global functional medium (3) sandwiched between the electrode layers (L1, L2), and f is a process-constrained minimum feature.

24 Claims, 12 Drawing Sheets

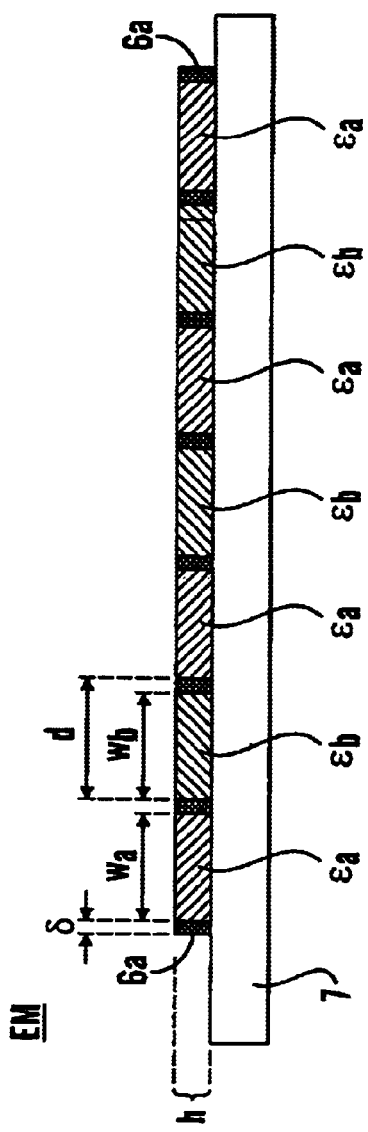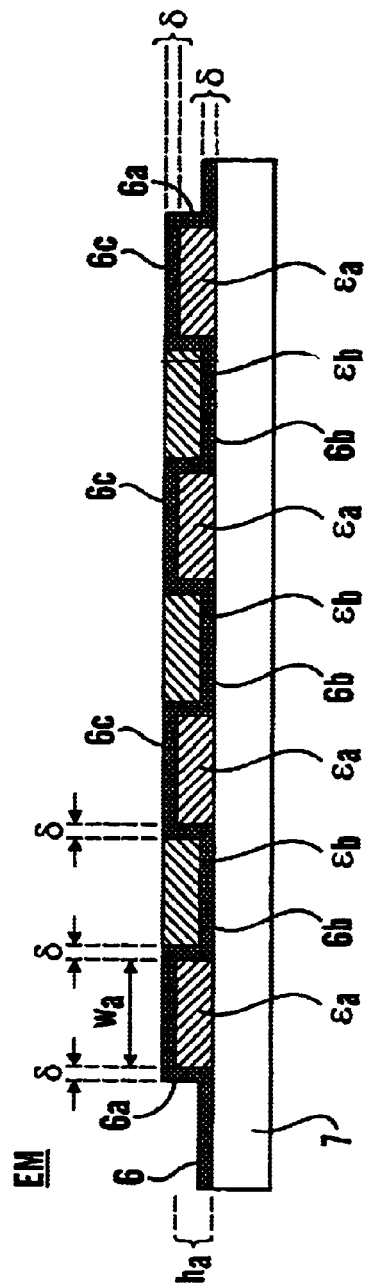

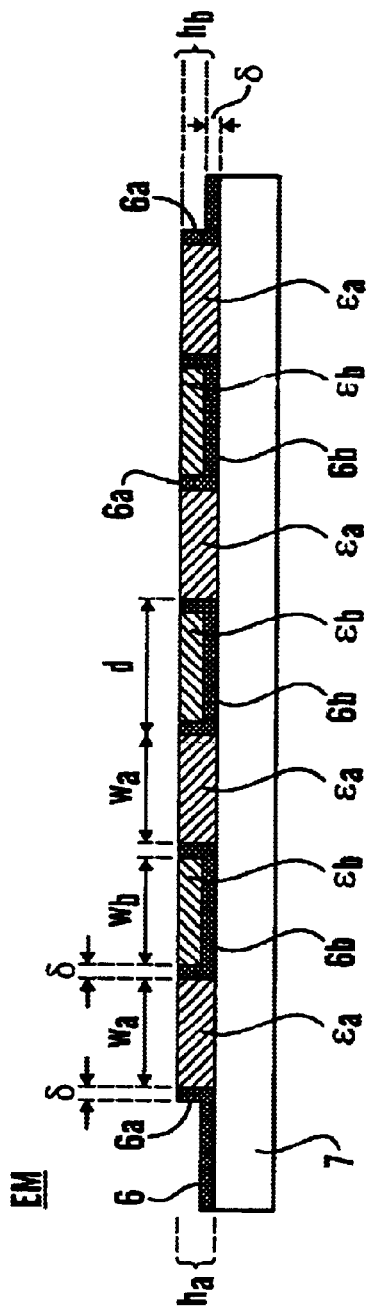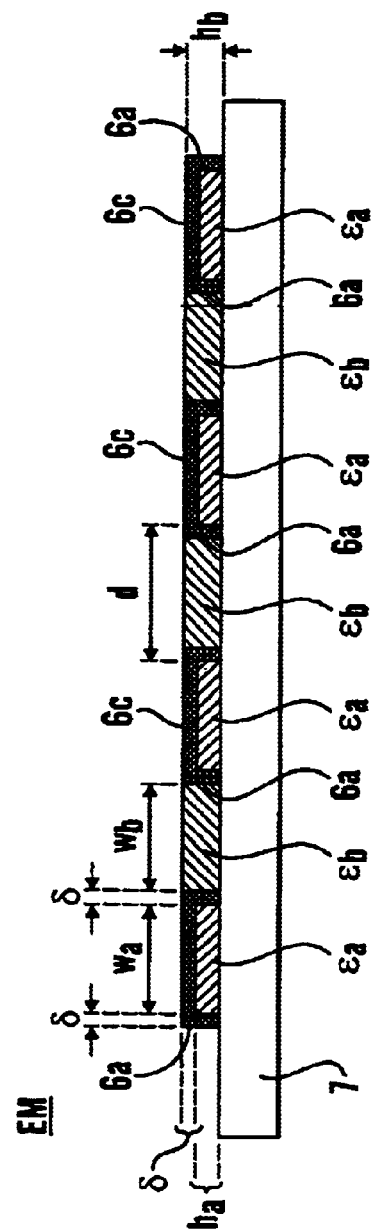

Figure 1A:
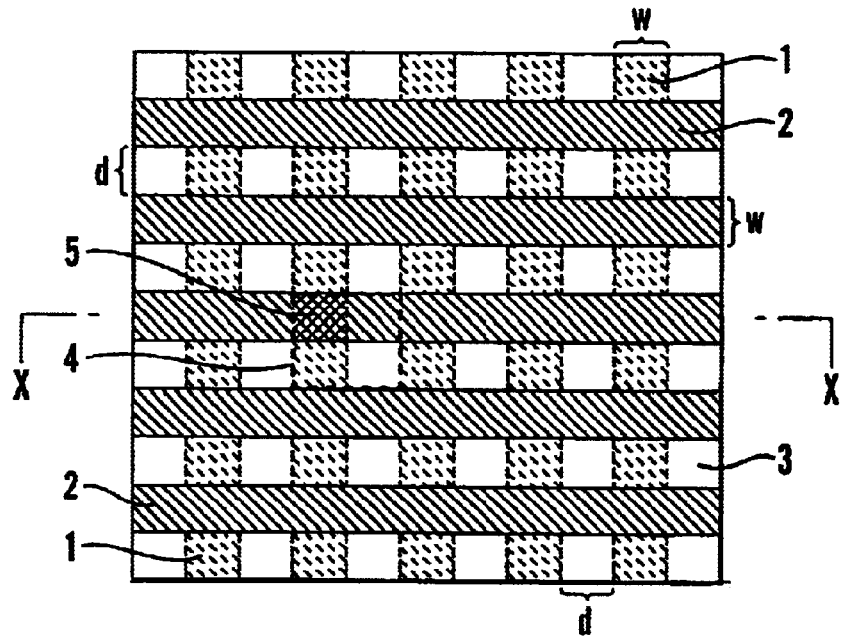

ELECTRODE MEANS, A METHOD FOR ITS MANUFACTURE, AN APPARATUS COMPRISING THE ELECTRODE MEANS AS WELL AS USE OF THE LATTER

This application claims priority on provisional Application No. 60/333,477 filed on Nov. 28, 2001, the entire contents of which are hereby incorporated by reference.

The present invention concerns an electrode means comprising first and second thin-film electrode layers with electrodes in the form of parallel strip-like electrical conductors in each layer, wherein the electrodes of the second electrode layer are oriented crosswise or substantially orthogonally to the electrodes of the first layer, wherein at least one of the electrode layers is provided on an insulating surface of a substrate or backplane, and wherein the electrode layers are provided in parallel spaced-apart planes contacting a globally provided layer of a functional medium therebetween; as well as a method for manufacturing an electrode means of this kind.

The present invention further concerns an apparatus comprising at least one electrode means comprising first and second thin-film electrode layers with electrodes in the form of parallel strip-like electrical conductors in each layer, wherein the electrodes of the second electrode layer are oriented crosswise or substantially orthogonally to the electrodes of the first layer, wherein at least one of the electrode layers is provided on an insulating surface of a substrate or backplane, and wherein the electrode layers are provided in parallel spaced-apart planes contacting a globally provided layer of a functional medium therebetween, wherein functional elements are formed in volumes of the functional medium defined at respective overlaps between electrodes of the first electrode layer and the electrodes of the second electrode layer to provide a matrix-addressable array, wherein a functional element can be activated by applying a voltage to the crossing electrodes defining the functional element such that a potential is generated across the latter, whereby the physical state of a functional element may be temporarily or permanently changed or a switching between discernible physical states take place, said voltage application essentially corresponding to an addressing of the functional element for write or read operations thereto, and wherein the functional elements according to the properties of a selected functional material can be made to operate as at least one of the following, viz. switchable logic elements of a data processing apparatus, memory cells in a data storage apparatus, or pixels in an information displaying apparatus, whereby the addressing of said elements, cells or pixels in any case takes place in a matrix-addressing scheme.

Finally, the present invention also concerns uses of the electrode means according to the invention in the apparatus according to the invention.

The present invention particularly concerns electrode means for use in apparatuses and devices comprising functional elements in a planar array, wherein the functional elements are addressed via respectively a first electrode means with parallel strip-like electrodes arranged in contact with the functional elements on one side thereof and another electrode means with similar electrodes, but oriented perpendicular to the electrodes of the first electrode means and provided in contact with the opposite side of the functional elements. This constitutes what is called a matrix-addressable device. Such matrix-addressable devices can comprise e.g. functional elements in the form of logic cells, or in the form of memory cells. The functional elements may include one or more active switching means, in which case the matrix-addressable device is termed an active matrix-addressable device, or the functional elements may consist of passive means only, e.g. resistive or capacitive means in which case the matrix-addressable device is termed a passive matrix-addressable device.

The latter is regarded as providing a most efficient way of addressing, for instance in case of memory devices, as no switching elements, viz. transistors are required in a memory cell. It is then desirable to achieve as high storage density as possible, but present design rules which set a lower limit to the cell, also limit the fill factor thereof, i.e. the area of the memory material of the matrix-addressable memory device that actually can be used for storage purposes.

A prior art passive matrix-addressable device is shown in FIG. 1a and comprises an essentially planar global layer 3 of functional material in sandwich between a first electrode means comprising parallel strip-like electrodes 1 of width w and spaced apart by a distance d and a similar second electrode means comprising parallel strip-like electrodes 2 of the same width w, but with the electrodes 2 arranged perpendicular to the electrodes 1. In the global layer 3 of functional material the overlap between the electrodes 1, 2 of the respective electrode means defines a functional element 5 in the functional material of the global layer 3. By applying voltage to the electrodes crossing at this location, a physical state of the functional element which e.g. can be a logic cell, or a memory cell, may be changed or switched.

Figure 1B:
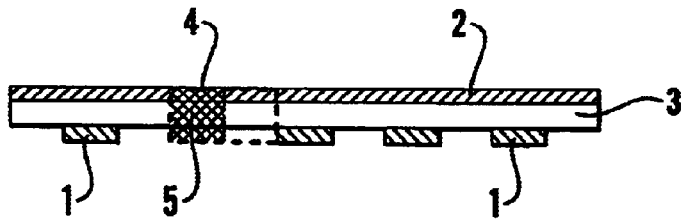

FIG. 1b shows the prior art device of FIG. 1a in a section taken along the line X—X making the layout of the electrodes 1,2 and the global layer of the sandwiched functional material 3 as well as the location of the functional element 5 apparent. The functional material of the global layer 3 usually has properties such that an application of the voltage to crossing electrodes 1,2 only will affect the functional element 5 at the crossing thereof and not neighbouring functional elements or cells at the electrodes crossings in the vicinity of the former. If the functional material of the global layer e.g. is electrically conducting, this can be achieved by providing it with anisotropic conducting property, such that conduction only can take place in a vertical direction to the functional material and between the overlapping electrodes, with no current flowing through the global layer to the other functional elements. However, for a large number of applications the functional material of the global layer can be non-conducting, i.e. dielectric, and the functional element can be regarded as highly resistive or a pure dielectric such that it will be behave like a capacitor. The dielectric material may be a polarizable inorganic or organic material and capable of exhibiting hysteresis. Such materials include both ferroelectric and electret materials and their capability of becoming polarized and exhibiting hysteresis are exploited in e.g. ferroelectric matrix memories or electret matrix memories with a device configuration similar to that shown in FIG. 1a. In such devices the polarization state in a memory cell, i.e. the functional element 5, may be set by a proper application of voltages to the electrodes defining the memory cell 5 at their overlap and the polarization can be switched or the cell can be restored to an initial state by operations which shall conform to write and read operations to the memory cell. The functionality of such matrix devices is, of course, not only dependent on the functional material selected, but also on architectural and structural constraints of the memory device. The storage capacity in the memory medium in this global layer 3 depends on the size and density of the memory cells 5 and these will in their turn depend on the minimum process-constrained feature that can be created in the manufacturing process. Such features are e.g. when electrodes are laid down as metallization which afterwards is patterned in a photomicrolithographic process resorting to photolithographic masks and e.g. etching, dependent on the smallest process-constrained feature f that can be defined by the mask and its value will in its turn depend on the wavelength of the light used. In other words, this feature f will usually within the scope of today's technology be limited to say 0.15–0.2 μm, and hence the width w of the electrodes 1,2 and the spacings therebetween will be of about this magnitude.

Figure 1C:
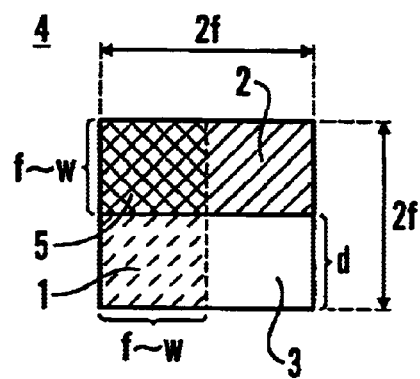

In that connection it should be noted that the value 2f usually is termed the pitch and that the maximum number of lines per unit length as obtainable with prior art fabrication technology is given by the factor ½f and correspondingly the maximum number of features per unit area by the factor ¼$f^2$. Hence if the area 4 shown in FIG. 1 is considered, it will be evident that the size of the cell is given by $f^2$ as apparent from FIG. 1c which shows the area 4 in greater detail. Each cell requires a real estate corresponding to the area 4, the size of which is 4$f^2$, in other words, four times larger than the area $f^2$ of the cell. This consideration shows that the matrix in FIG. 1a has a fill factor of 0.25, i.e. $f^2/4f^2$. The degree of exploitation of the area offered by the layer 3 is thus low. In order to arrive at a higher fill factor or a higher density of functional elements or cells 5 in the global layer 3 it would be desirable to increase either the fill factor or to obtain a higher resolution in the process-constrained features of the matrix, e.g. into the sub-0.1 μm range. However, although this may increase the total number of cells in similar area, still would not be able to guarantee a higher fill factor.

In the matrix devices of the active kind, i.e. also comprising at least one active switching element associated with each functional element or cell, the fill factor becomes even lower, typically in the order of ⅙, i.e. a fill factor of only 16.7%.

From U.S. Pat. No. 5,017,515 (Gill, assigned to Texas Instruments Inc.) there is known a process for forming sublithographic distances between elements in an integrated circuit. As depicted in FIG. 1 of this publication this process is suitable for forming an electrode layer with dense parallel strip-like electrodes 13, 19 mutually isolated by an isolation feature 14 which is not subject to any dimensional constraints as imposed by the use of a photomicrolithographic process, but which can be made very thin indeed compared to the dimensions of the conductors or the electrodes. The publication discloses how an electrode means of this kind can be used for forming stripe-like floating gate electrodes in an integrated circuit device, e.g. a semiconductor memory device with memory cells comprising a switching and storage transistor structure respectively. Bit lines are formed by a suitable doping of a substrate, evidently using the same photomask in the doping process as used in the process for forming the dense electrode layer. The bit lines and word lines/control gate electrodes 42 are formed separated by an insulator from floating gates 13 and 19, resulting structure being an array of semiconductor memory with multiterminal memory cells comprising transistors. However, no hint or directions are given in U.S. Pat. No. 5,017,515 for forming an electrode means with two electrode layers each comprising electrodes in a dense arrangement and oriented such that the electrodes of the two electrode layers together forms an electrode matrix suitable for addressing functional elements in a globally provided layer of a functional medium located between the electrode layers and contacting the electrodes thereof. The efficient exploitation of matrix addressing of a global layer of a functional medium also presupposes a high degree of planarization inherent in the layers of a matrix-addressable device of this kind, but this is not readily achieved in the prior art technology as the creation of topographical structures extending orthogonally above the substrate shall imply that additional electrode layers would reproduce the outline of these structures in the surface features. Also the prior art would be unsuitable in case a plurality of such matrix-addressable arrays shall be stacked to form volumetric devices, e.g. a stack of a plurality of matrix-addressable memory device as known in the art.

An example of a passive matrix-addressable data processing or memory device with electrode layers disposed on either side of the functional medium such that the electrodes form an orthogonal electrode matrix, is for instance disclosed in published International application WO098/58383. Obviously an apparatus of this kind shall benefit with regard to increasing the density of the functional elements in the matrix by increasing the fill factor of the electrodes in each electrode layer, as the functional elements in the matrix which may correspond e.g. to a memory cell, in any case shall be defined by the overlap area formed by the crossing between the electrodes of the first and second electrode layer respectively.

In view of the above considerations it is a major object of the present invention to enable an increase of the fill factor in matrix devices of the afore-mentioned kind to a value approaching unity and achieve a maximum exploitation of the real estate offered by the global layer 3 of the functional material in such devices without actually being constrained by the actual or practical size of the minimum process-constrained feature f, as the fill factor will not be influenced by decrease in f, although such a decrease of course, will serve to further increase the maximum number of functional elements or cells obtainable in a global layer 3.

Matrix devices of the kind shown in FIG. 1a may be stacked on the top of each other to form volumetric devices in which case a single device is separated from the following device in the stack by a separation or isolating layer to prevent the application of voltages to electrodes in one of the devices and the switching of functional elements therein from affecting neighbouring devices in the stack. Such volumetric devices shall, of course, allow for large-capacity volumetric memory devices, but it will be easily seen that if the fill factor could be increased to unity or 100%, the total capacity of a single matrix device then might approach the capacity of four similar conventional matrix devices stacked to form a volumetric device.

While there in theory is no limit as to the number of devices forming the stack, it is a disadvantage that undesired kinds of electrical, physical and thermal couplings may be introduced between the devices in the stack upon, say a massive parallel addressing of functional elements in the various devices. A further disadvantage is an inherent unevenness in each single device of the stack. Although a device may be regarded as substantially planar, the unevenness will propagate as devices are added to the stack which obtains an increasing bumpiness as device after device are stacked upon each other. Such bumpiness will also be very undesirable in an essentially planar circuit technology.

In light of this a secondary object of the present invention is an increase the overall capacity with regard of the number of functional elements that can be obtained in a matrix device, thus reducing the need for developing multilayer or volumetric devices, i.e. a stack with many layers, when a comparable capacity can be achieved with a stack comprising only a quarter of the number of devices or layers that would be needed in prior art technology.

Finally, it is also an object of the present invention to provide an electrode means that easily can be processed to provide a high degree of planarity, thus avoiding surface unevenness or bumpiness and making the electrode means better suited for application in stacked volumetric devices.

The above objects as well as further advantages and features are achieved according to the present invention with an electrode means which is characterized in that each of the thin-film electrode layer comprises a first set of said strip-like electrodes of width $w_a$ and thickness $h_a$ provided on the substrate, the electrodes of the first set being mutually spaced apart by distance d equal to or greater than $w_a$, a second set of said strip-like electrodes with width $w_b$ and thickness $h_b$ provided in the spacings between the electrodes of the first set and electrically insulated therefrom by a thin film of an electrically insulating material with thickness $\delta$ and at least extending along the side edges of the parallel electrodes and forming an insulating wall of thickness $\delta$ therebetween, the magnitude of $\delta$ being small compared to the magnitude of either $w_a$ or $w_b$, with the spacing distance d between the electrodes of the first set being $w_b + 2\delta$, and that the electrode layers with electrodes and the insulating thin film forms global planar layers in the electrode means.

Advantageously the conducting material of the electrodes in at least one electrode layer can be provided directly on the surface of the substrate.

Also advantageously the electrodes of one of the electrode layers can be exposed to the exterior of the surface thereof opposite the other electrode layer or alternatively can the surface of one of the electrode layers opposite to the other electrode layer be covered by a backplane.

In an advantageous embodiment of the electrode means according to the invention the sectional area of the electrodes of both sets is equal, such that $w_a \cdot h_a = w_b \cdot h_b$.

In another advantageous embodiment of the electrode means according to the invention the sectional area of the electrodes of the first set is different from that of the electrodes of the second set such that $w_a \cdot h_a \neq w_b \cdot h_b$.

In further advantageous embodiment of the electrode means according to the invention the conducting material of the electrodes of both sets is the same.

In a yet further advantageous embodiment of the electrode means according to the invention the conducting material of the electrodes of the second set is different from the conducting material of the electrodes of the first set.

In the latter case it is preferred that the conducting material of the electrodes of the first set and the conducting material of the electrodes of the second set have conductivities of magnitudes $\sigma_a$, $\sigma_b$ respectively, such that a relation $$\frac{w_a}{w_b} \div \frac{h_a}{h_b} = \frac{\sigma_b}{\sigma_a}$$

is obeyed, making the conductive capacity of each electrode of the first and second electrode sets respectively, equal in any case.

In a preferred embodiment of the electrode means according to the invention the insulating walls between the electrodes of the first set and the electrodes of the second set form a portion of the insulating thin film provided in a continuous layer covering the electrodes of the first set and in case also a substrate in the spacings between the former, the electrodes of the second set are provided in recesses between the wall portions of the insulating thin film and in case also above a portion thereof covering the substrate, the top surface of electrodes of the second set being flush with the surface of a portion of the insulating thin film covering the top surface of the electrodes of the first set, whereby the electrodes of both the first and the second sets have the equal heights $h_a = h_b$, and the electrode layers with electrodes and the insulating thin film form a global planar layers in the electrode means.

In another preferred embodiment of the electrode means the insulating walls between the electrodes of the first set and the electrodes of the second set form portions of the thin film of insulating material provided in a layer covering the side edges of the electrodes of the first set up to the top surface thereof and in case also a substrate in the spacings between the former, the electrodes of the second set are provided in recesses between the wall portion of the insulating thin film and in case also above the portion thereof covering the substrate, the electrodes of the second set being flush with the top edge of the insulating walls as well as the top surface of the electrodes of the first set, whereby the electrodes of the second set have the height $h_b = h_a - \delta$, and the electrode layers with electrodes and insulating material form a global planar layers of thickness $h_a$ in the electrode means.

In yet another preferred embodiment of the electrode means according to the invention the insulating walls between the electrodes of the first set and the electrodes of the second set form a portion of the insulating thin film provided in layer covering the electrodes of the first set down to a substrate, the electrodes of the second set are provided in recesses between the wall portions of the insulating thin film and directly on the exposed substrate and flush with the top surface of a portion of the insulating thin film covering the top surface of the electrodes of the first set, whereby the electrodes of the first set have the height $h_a = h_b - \delta$, and the electrode layers with electrodes and the insulating thin film forms global planar layers of thickness $h_b$ in the electrode means.

The objects of the invention as well as the additional advantages and features are also achieved according to the present invention with a method for manufacturing an electrode means, the method being characterized by steps for depositing a planar layer of electrical conducting material with a thickness $h_a$ on the substrate, patterning said planar layer of conducting material to form a first set of said strip-like electrodes with width $w_a$ and thickness $h_a$ mutually spaced apart by recesses therebetween created in the patterning process removing portions of the conducting material and exposing the surface of the substrate between the strip-like electrodes of the first set, the parallel electrodes of the first set thus being spaced apart by the distance d being equal to the width of the recesses between said electrodes and equal to or greater than $w_a$, forming a thin film of electrically insulating material covering at least the side edges of the electrodes of the first set, and depositing an electrical conducting material in the recesses between the insulating thin film covering the side edges of the electrodes of the first set to form a second set of electrodes with a width $w_b$ and thickness $h_b$, such that the electrode layer is obtained as a global planar layer in the electrode means.

In an advantageous embodiment of the method according to the invention the insulating thin film is formed as global layer covering both the first set of electrodes and the exposed surface of the substrate, the conducting material for electrodes of the second set deposited in the recesses between the electrodes of the first set and above the insulating thin film, and the electrode layer planarized such that the top surfaces of the electrodes of the second set are flush with the insulating thin film covering the electrodes of the first set.

In another advantageous embodiment of the method according to the invention the insulating thin film is formed as global layer covering the electrodes of the first set and the exposed surface of the substrate, the conducting material for electrodes of the second set deposited in the recesses between the electrodes of the first set and above the insulating thin film, and the electrode layer planarized such that the insulating thin film covering the electrodes of the first set is removed to expose the top surfaces of said electrodes and such that the surfaces of the electrodes of the of both sets and top edges of the insulating thin film all are flush in the top surface of the electrode layer.

In yet another advantageous embodiment of the method according to the invention the insulating thin film is formed as global layer covering both the electrodes of the first set and the exposed surface of the substrate, the insulating thin film at the bottom of the recesses removed, leaving only the insulating thin film covering the electrodes of the first set down to substrate and exposing the surface thereof, the conducting material of the electrodes of the second set deposited in said recesses, and electrode layer planarized such that the top surfaces of the electrodes of the second set and the surface of the insulating thin film covering the electrodes of the first set all are flush in the top surface of the electrode layer.

In a preferred embodiment of the method according to the invention a global layer of a functional medium can be deposited covering the one electrode layer provided on a substrate and contacting the electrodes thereof and a second electrode layer then formed directly on the global layer of a functional medium by similar steps as those used for forming an electrode layer on the substrate. Preferably can then a substrate or a backplane be provided covering the electrode layer formed on the global layer of a functional medium.

In the method according to the invention it is preferable selecting the conducting material of the electrodes of the first set and/or a substrate material as materials amenable to surface oxidation, and forming the insulating thin film by oxidizing the surface of either in at least one oxidation process as appropriate.

Finally, the above objects as well as further advantages and features are achieved according to the present invention with an apparatus characterized in that the electrodes of each electrode means are provided in a respective electrode layer, that the electrodes in the electrode means all have about the same width w, that electrodes of each means are mutually insulated electrically by an insulating thin film of thickness $\delta$, the magnitude of $\delta$ being a fraction of the width w, and that minimum magnitude of w is comparable to a process-constrained minimum feature size f, whereby the fill factor of functional elements in functional medium relative thereto is close to 1 and the number of functional elements approaches a maximum defined by the total area A of the functional medium sandwiched between the electrode means and said feature size f, said maximum thus being defined by $A/f^2$.

Finally, the above objects as well as further advantages and features are achieved according to the present invention with the use of the electrode means according the invention in the inventive apparatus in order to perform a passive matrix addressing to the functional elements constituting the matrix-addressable array of the apparatus, as well as the use of the electrode means according to the invention in the inventive apparatus wherein each functional element is connected with at least one active switching component, in order to perform an active matrix addressing to the functional elements constituting the matrix-addressable array of the apparatus.

Figure 2A:
Figure 2B:
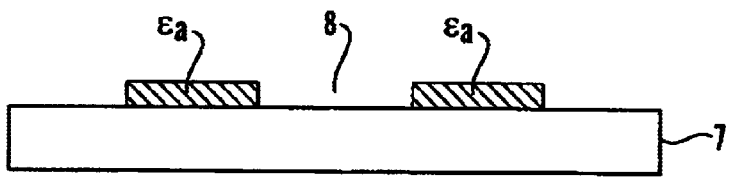
Figure 2C:
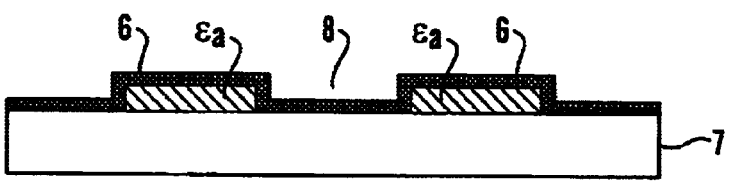
Figure 2D:
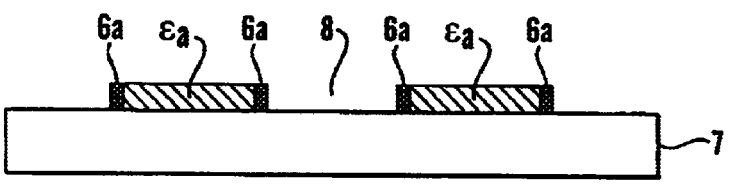
Figure 2E:
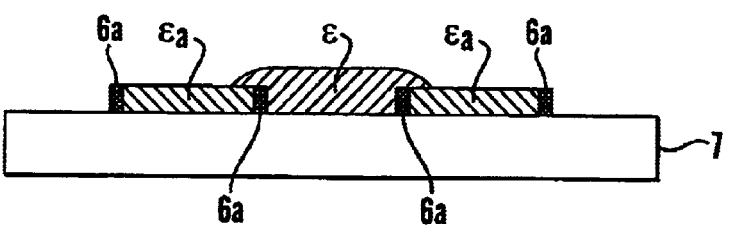
Figure 2F:
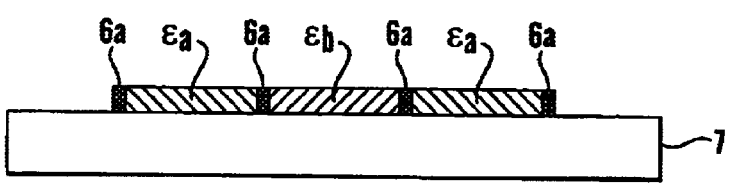
Figure 3A:
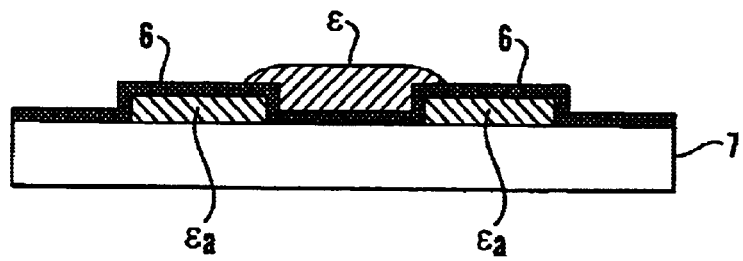
Figure 4A:
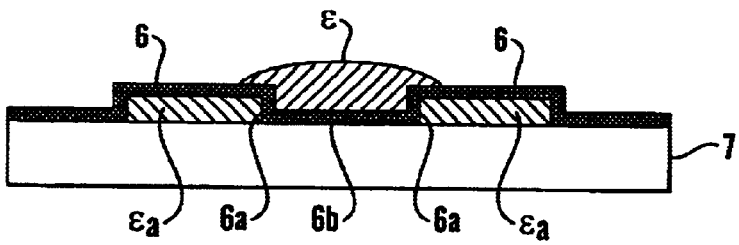
Figure 5A:
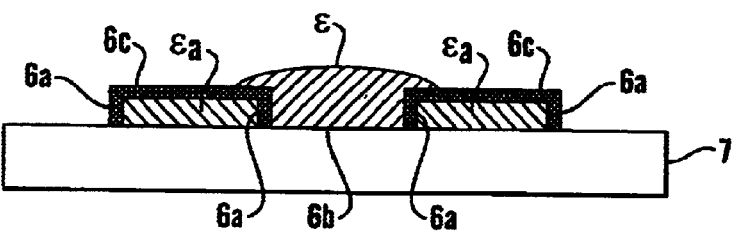
Figure 6A:
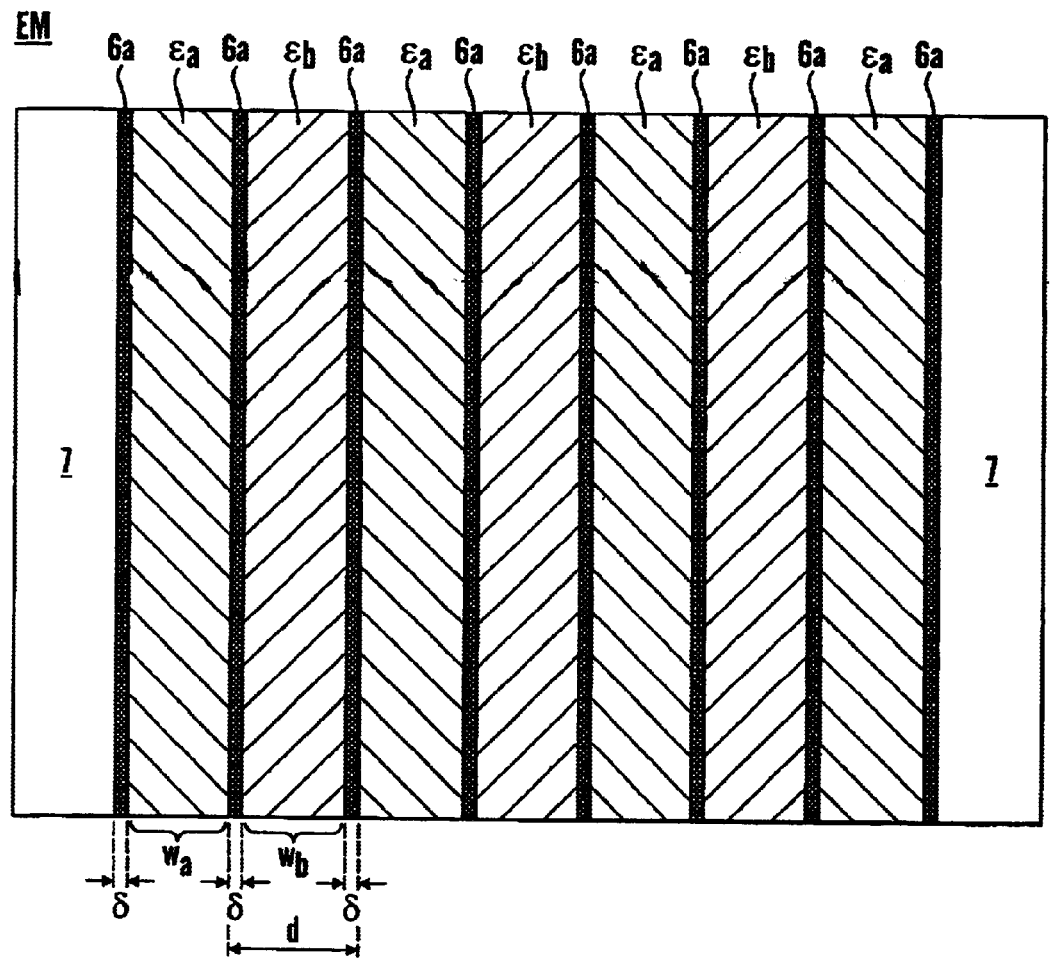
Figure 9A:
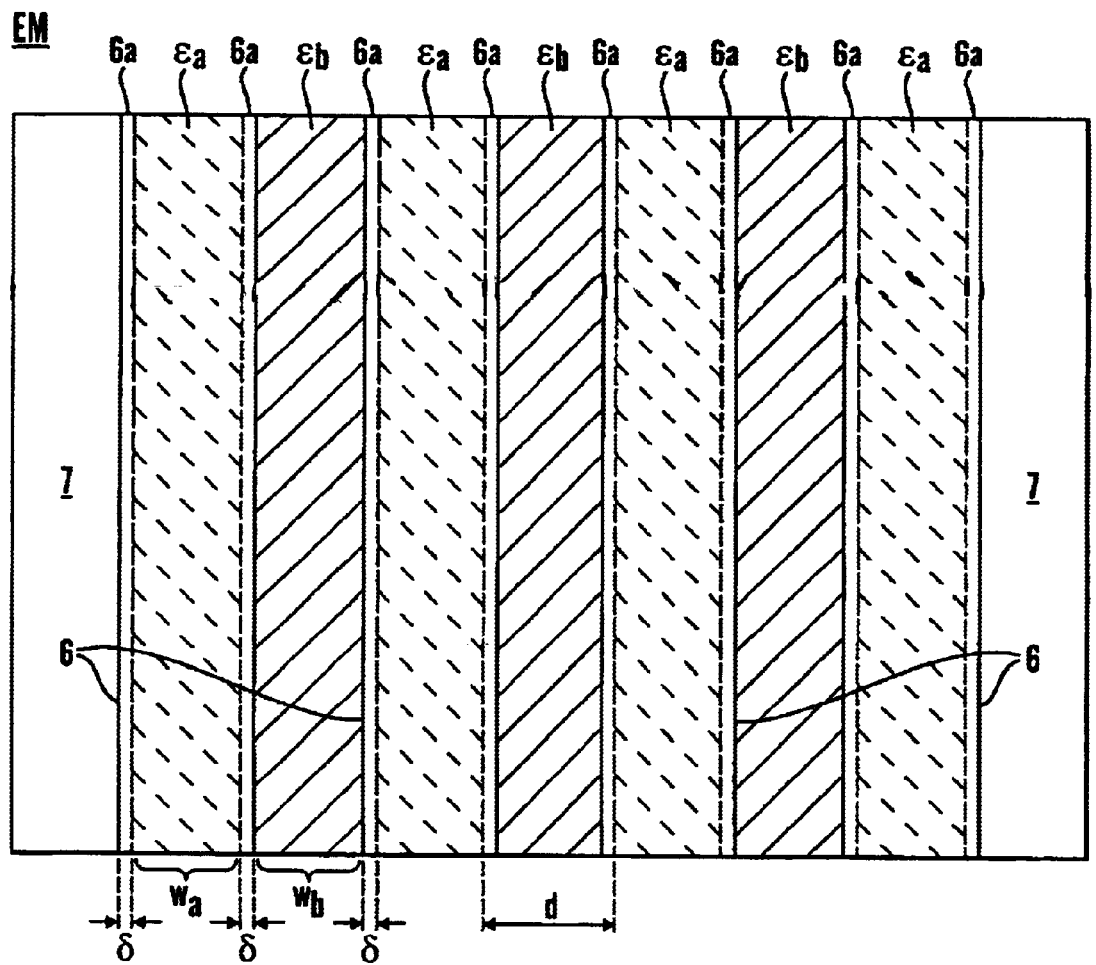
Figure 10A:
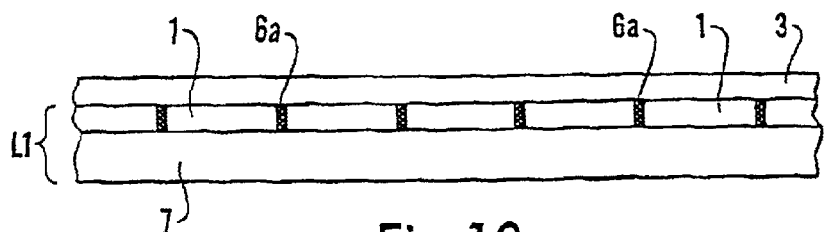
Figure 10B:
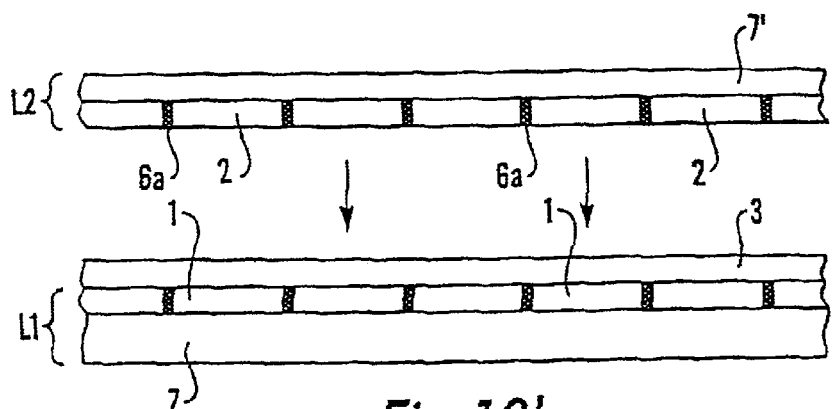
Figure 10C:
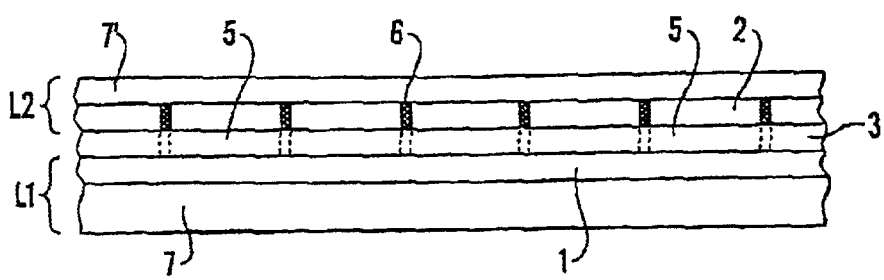
Figure 10D:
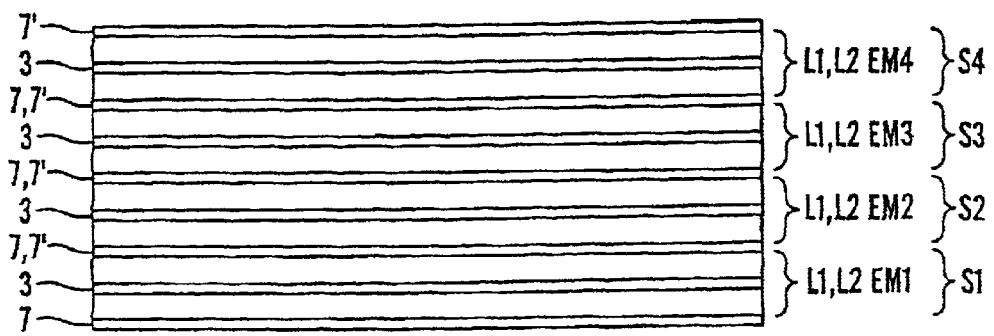
Figure 11A:
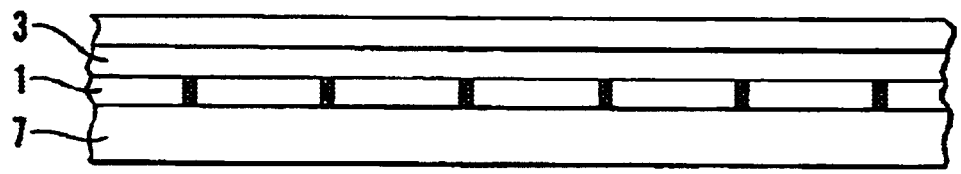
Figure 11B:
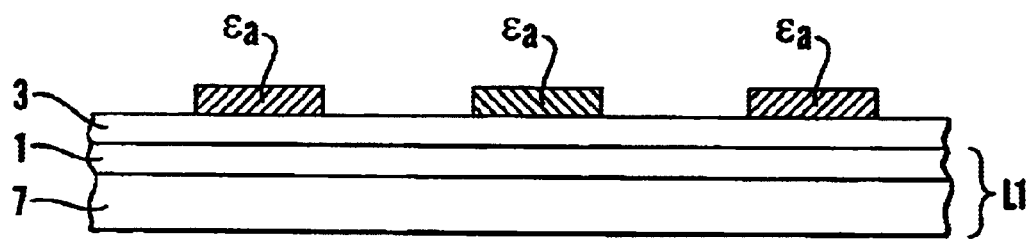
Figure 11C:
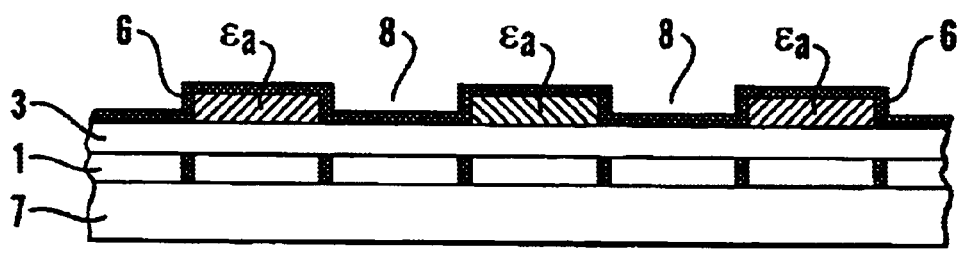
Figure 11D:
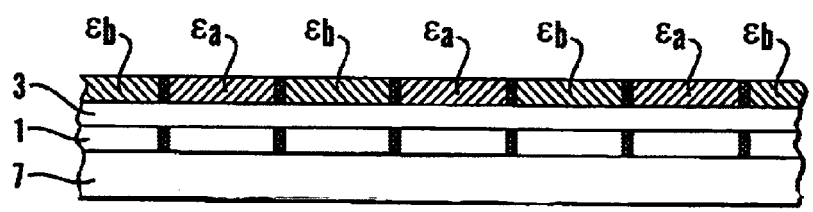
Figure 11E:
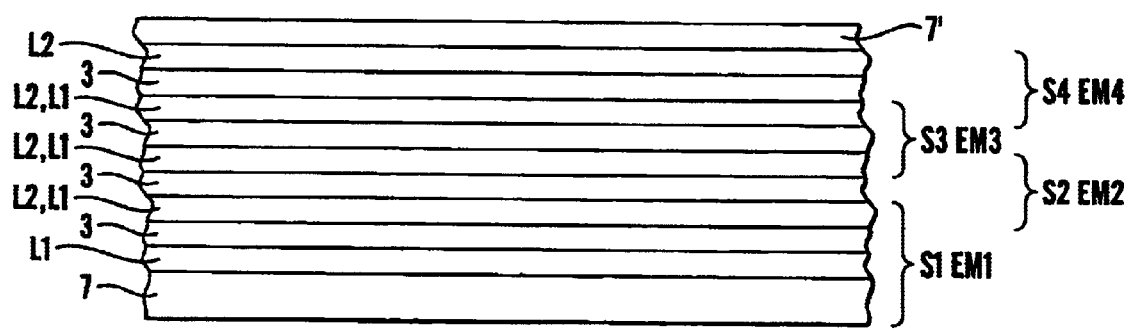
Figure 12A:
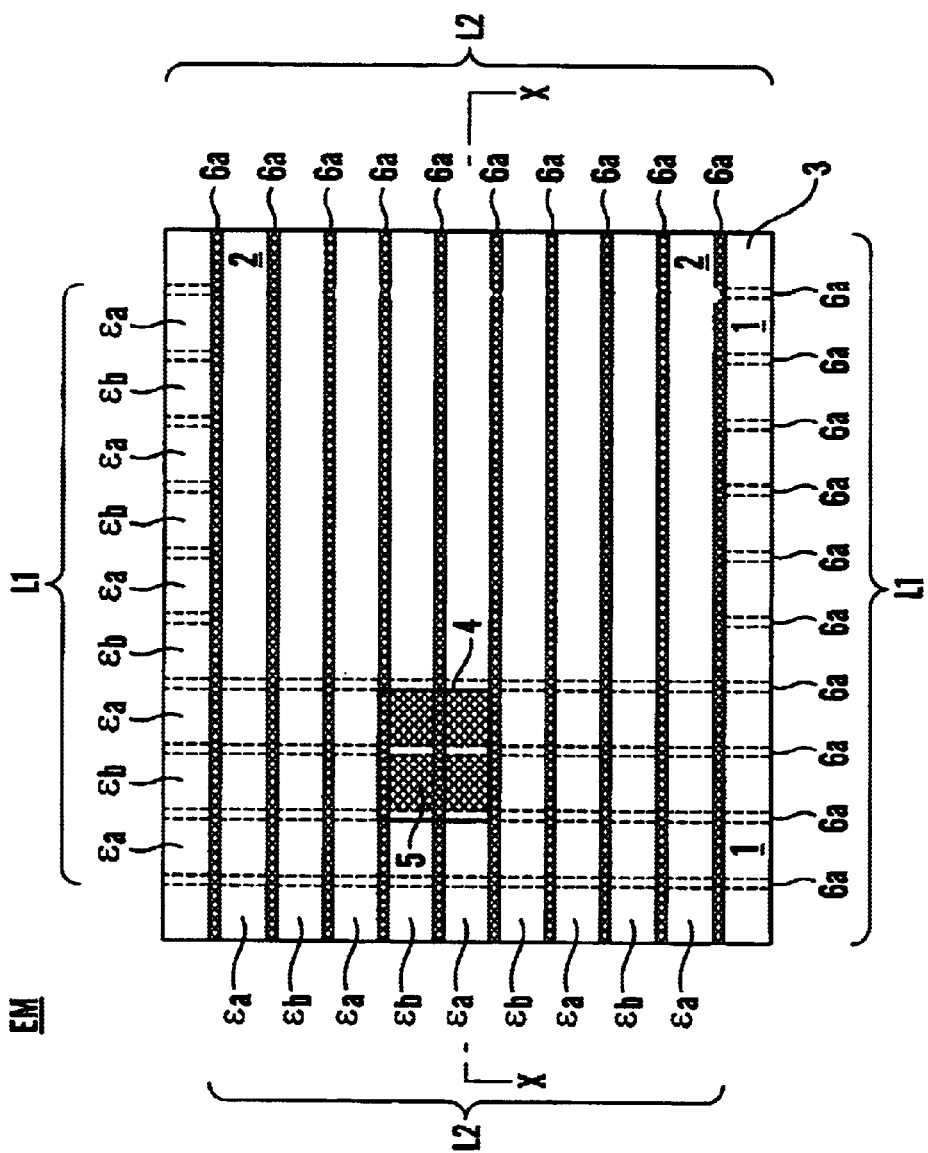
Figure 12B:
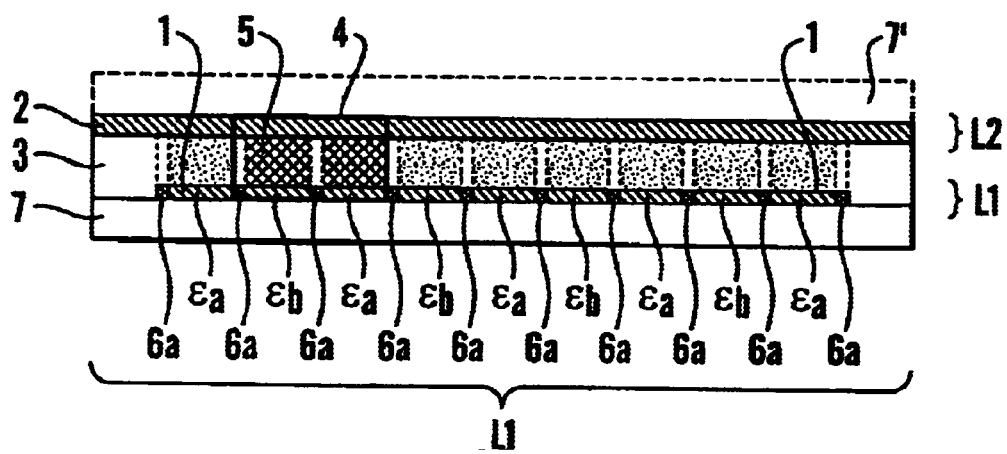
Figure 12C:
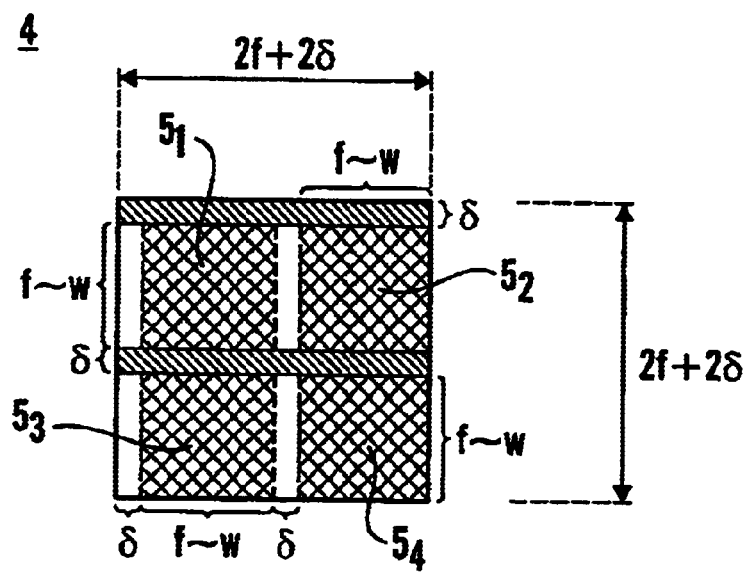

The present invention will be better understood by reading the following description of exemplary embodiments of the electrode means and the method for the manufacturing thereof and a description of an embodiment of the apparatus in conjunction with the appended drawings, in which FIGS. 1a,b,c show a prior art passive matrix-addressable device exemplifying a conventionally attainable fill factor in such devices, FIGS. 2a–2f schematically process steps for manufacturing a first embodiment of an electrode layer according to the present invention, FIGS. 3a,b schematically process steps for the manufacturing a second embodiment of the electrode layer according to the present invention, and deriving from the process step of FIG. 2c, FIGS. 4a,b schematically process steps for manufacturing a third embodiment of an electrode layer according to the present invention, and deriving from the process step of FIG. 2c, FIGS. 5a,b schematically process steps for manufacturing a fourth embodiment of an electrode layer according to the present invention, and deriving from the process steps of either FIG. 2b or FIG. 2c, FIG. 6a schematically a plan view of a first embodiment of an electrode layer in the electrode means according to the present invention, FIG. 6b schematically a cross section of the embodiment in FIG. 6a, FIG. 7 schematically a cross section of a second embodiment of an electrode layer in the electrode means according to the present invention, FIG. 8 schematically a cross section of a third embodiment of an electrode layer in the electrode means according to the present invention, FIG. 9a schematically a plan view of a fourth embodiment of an electrode layer in the electrode means according to the present invention, FIG. 9b schematically a cross section of the embodiment in FIG. 9a, FIG. 10a a cross section of a first electrode layer in the electrode means according to the invention and covered by a global layer of a functional medium, FIG. 10b the second electrode layer in a similar embodiment as the one of the first electrode layer and positioned to form the electrode means according to the invention, FIG. 10c a preferred embodiment of the electrode means according to the invention, FIG. 10d how a plurality of electrode means can be stacked to form a volumetric device, FIGS. 11a–d steps in the manufacture of another embodiment of the electrode means according to the invention, FIG. 11e how a plurality of electrode means according to this embodiment can be stacked to form a volumetric device, FIG. 12a a plan view of a passive matrix-addressable device in an embodiment of the apparatus according to the invention and with electrode means according to the present invention, FIG. 12b a section taken along line X—X in FIG. 12a, and FIG. 12c a detail of FIG. 12a and illustrating the fill factor attainable with the present invention.

Now the electrode means according to the present invention shall be discussed with reference to FIGS. 1–5, illustrating the manufacture of various embodiments of an electrode layer in the electrode means according to the invention. It should be noted that these figures are very schematic and limited to show only the sufficient number of strip-like electrodes that is necessary to explain the manufacturing steps and structure of an electrode layer in the electrode means according to the invention.

The electrode means according to the invention of course comprises two electrode layers L1, L2 of this kind and with the electrodes ε facing a global layer 3 of a functional medium therebetween and contacting the electrodes therein. The second electrode layer 2 can of course be manufactured in similar steps and embodiments as those described before and appropriately positioned and assembled with the first electrode layer L1 and the global layer 3 of a functional medium in an appropriate manner. This shall be explained further below with reference to a couple of preferred embodiments of the electrode means EM and how such embodiments of the electrode means can be stacked to form a volumetric structure comprising a plurality of the electrode means according to the invention.

In FIG. 2a a substrate which may be made of any suitable material, but which in any case either should be insulating or have at least one insulating surface, is provided with a layer ε of conductive material. This layer ε could in case be provided on an insulating surface of the substrate 7. In a second step shown in FIG. 2b the conducting material ε which has been provided as a global layer covering the substrate 7 are patterned into parallel strip-like electrodes $\epsilon_a$ forming the electrodes of a first electrode set $E_a$ separated by a distance d so as to form a recess 8 therebetween. It shall now be understood that the width w of the electrodes $\epsilon_a$ obtainable in the patterning process will be limited downwards to a minimum process-constrained feature of magnitude f, for instance when using conventional photomicrolithography and patterning with photomasks and by subsequent etching. The value of f could then be in the range down to 0.15 μm or less and this would then correspond both to the minimum width of the electrodes $\epsilon_a$ as well as the width d of the recess 8 therebetween.

In a third process step shown in FIG. 2c the strip-like electrodes $\epsilon_a$ and the exposed portions of the substrate 7 are covered by a thin film 6 of insulating material, deposited or formed by means of any suitable process, e.g. by chemical vapour deposition, spraying etc. As known to persons skilled in the art, this insulating layer 6 then can be extremely thin, say in the range of a few nanometres and indeed have a very small thickness δ compared to the width $w_a$ of the electrodes $\epsilon_a$.

In a fourth process step shown in FIG. 2d the insulating layer 6 covering the electrodes $\epsilon_a$ and the substrate 7 is removed and this removal can take place by a process different from the one used for patterning the electrodes $\epsilon_a$, or alternatively by a combination of suitable process, but conventionally the preferred process will be photomicrolithography with subsequent etching. Corresponding photomasks as used in the step shown in FIG. 2b could then be used, e.g. adapted to the width $w_a$ of the electrodes $\epsilon_a$ and as applicable also to the width d of the recess 8 therebetween. After the fourth process step a structure such as depicted in FIG. 2d is obtained. The only portion that remains of the thin-film layer is the wall portions 6a thereof extended along the side of the strip-like electrodes $\epsilon_a$.

In a fifth process step shown in FIG. 2e another conductive material ε which in any case could be the same as the one used for the electrode set $E_a$ is provided in the recesses 8 between the electrodes $\epsilon_a$. This conductive material ε could also of, course, be provided in a global layer covering both the electrode $\epsilon_a$ and recesses 8, but is in the figure shown deposited mainly to fill the recesses only. This deposition can take place in a similar fashion as for the deposition of the layer ε in FIG. 2a, i.e. it can be vapour-deposited, sprayed etc.

Finally FIG. 2f depicts a planarization step wherein conductive material ε is removed down to the height of the insulating wall portions 6a, such that it now forms a strip-like electrode $\epsilon_b$ of a second electrode set $E_b$ between electrodes $\epsilon_a$ of the first electrode set $E_a$ and electrically insulated therefrom by the insulating wall portions 6a of the insulating thin film 6. The recess 8a for the process step illustrating FIG. 2e could be regarded as casting mould and the conducting material ε provided therein by any suitable casting process.

This resulting embodiment of an electrode layer for use in electrode means according to the invention and schematically illustrated in FIG. 2f is shown in plan view in FIG. 6a. Herein the electrode layer L comprises a plurality of strip-like parallel electrodes $\epsilon_a$, $\epsilon_b$ provided on the substrate 7. The electrodes $\epsilon_a$ can be envisaged as belonging to the first set $E_a$ of electrodes $\epsilon_a$ as resulting from the patterning step of FIG. 2b, while the electrodes $\epsilon_b$ between the former can be regarded as belonging to the second set $E_b$ of electrodes resulting from the process step depicted in FIGS. 2e and 2f. The distance between two electrodes $\epsilon_a$ is now d, the width of the electrodes $\epsilon_a$ is $w_a$ and the width of the electrodes $\epsilon_b$ is $w_b$. Now the values $w_a$, $w_b$ and d all will be comparable and have about the similar magnitude, the minimum value of which will be given by the value of the minimum process-constrained feature f obtainable in the patterning process for obtaining the structure in FIG. 2b. At the same time the thickness δ of the insulating wall portions 6a between the electrodes $\epsilon_b$, $\epsilon_a$ is not constrained by f and may have a thickness down to a nanometer scale, with the only constraint to provide an insulating thin film preventing electrical faults and breakdown between the electrodes $\epsilon_a$, $\epsilon_b$. In other words, provided that the surface of the substrate 7 interfacing the electrodes as required is also electrically insulating, all the parallel strip-like electrodes $\epsilon_a$, $\epsilon_b$ will be mutually electrically insulated. A section of the plan view in FIG. 6a shown in FIG. 6b needs no further explanation, although it is to be noted that the height of both the electrodes $\epsilon_a$, $\epsilon_b$ as well as the insulating wall portion 6a is h and that one has the equation d=$w_b$+2δ. Provided that distance d between the electrodes is selected as $w_a$+2δ, the width of electrodes $\epsilon_a$, $\epsilon_b$ will be the same and equal to a value w, all electrodes $\epsilon_a$, $\epsilon_b$ thus having the same cross-section area and if made of the same conducting material ε, also the same conducting properties.

The advantages of the electrode means EM comprising electrode layers L as discussed with regard to the attainable fill factors shall be explained below in connection with a discussion of the apparatus according to the invention as shown in FIG. 10a.

Figure 3B:
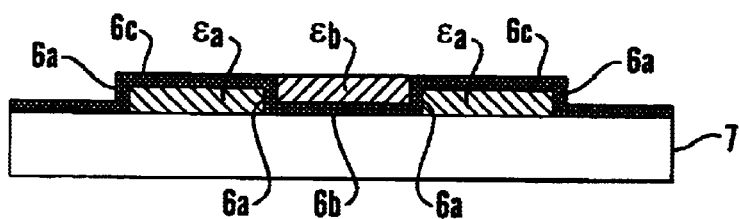

FIGS. 3a and 3b show the process step for manufacturing a second embodiment of an electrode layer L in the electrode means EM according to the present invention. The process step depicted in FIG. 3a has as a starting point the structure shown in FIG. 2c with the insulating thin film 6 already in place. As shown in FIG. 3a, an electrical conducting material ε which again can be the same as the conducting material of the electrodes $\epsilon_a$ is deposited in the recess 8 in FIG. 2c by any suitable process and then follows a planarization step resulting in the structure illustrated in FIG. 3b which conforms to the second embodiment of the electrode layer L according to the invention. In this embodiment the electrodes $\epsilon_a$ of the first set are covered by the insulating thin film 6 forming portions 6a along the side edges of the electrodes $\epsilon_a$, portions 6c of the top surface thereof, as well as portions 6b at the bottom of the recess 8 now covered the conducting material ε which in this step is processed to yield the electrodes $\epsilon_b$ of the second set $E_b$ with top surfaces of which flush with the portions 6c of insulating the thin film 6 covering the electrode $\epsilon_a$. Concerning this second embodiment which is shown in cross section in FIG. 7, it is to be noted that the electrodes 6a will not be in ohmic contact with any contacting material provided thereabove, but the insulating thin film 6 does not prevent a capacitive coupling between the electrode $\epsilon_b$ and a contacting material. Hence this embodiment of the electrode layer L according to the invention will be suitable for applications wherein the electrodes $\epsilon_a$, $\epsilon_b$ shall be used in circumstances requiring capacitive couplings only. Further it should be noted the height $h_b$ of electrodes $\epsilon_b$ is smaller than the height $h_a$ of the electrodes $\epsilon_a$ by an amount corresponding to the thickness $\delta$ of the insulating thin film 6. In order to obtain the same electrode cross sections for both electrodes $\epsilon_a$, $\epsilon_b$, the width $w_b$ of electrodes $\epsilon_b$ should be correspondingly enlarged to account for the fact that the height $h_b$ of these electrodes only can be $h_a-\delta$ after the planarization step making the top surface thereof flush with the insulating thin-film portion 6c, cf. FIG. 7.

Figure 4B:
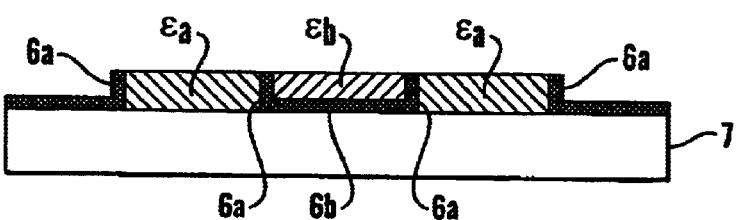

The process steps for manufacturing a third embodiment of the electrode layer L according to the present invention is shown in FIGS. 4a and 4b. FIG. 4a takes as its starting point the structure depicted in FIG. 2c, wherein the insulating thin film 6 is deposited globally covering in the substrate 7 and the electrodes $\epsilon_a$. A conducting material $\epsilon$ is now deposited filling and covering the recess 8 of FIG. 2c, resulting in the structure of FIG. 4a for the purpose of forming the electrode $\epsilon_b$ shown in FIG. 4b. The conducting material $\epsilon$ can of course be the same as that used for the electrodes $\epsilon_a$ as before. Now follows a planarization step, whereupon both the portion of the insulating thin film 6 covering the electrodes $\epsilon_a$ as well as excess electrode material $\epsilon$ are removed, and leaving the electrodes $\epsilon_a$, $\epsilon_b$ exposed in the surface of the electrode layer all mutually flush and flush with the top edge of the wall portions 6a of the insulating thin film 6 as shown in FIG. 4b. This third embodiment now corresponds to the one illustrated in cross section in FIG. 8, where it will be seen that all electrodes $\epsilon_a$, $\epsilon_b$ have exposed top surfaces and hence will be suitable for capacitive as well as ohmic coupling to a contact or functional material provided thereabove. The considerations regarding the minimum width $w_a$, $w_b$ of the electrodes $\epsilon_a$, $\epsilon_b$ are also valid here. Moreover, it will be seen that the height $h_a$ of an electrode $\epsilon_a$ differs from the height $h_b$ of an electrode $\epsilon_b$ by the amount $\delta$ corresponding to the thickness $\delta$ of the portion 6b of the thin film 6. This as before implies that the distance d between the electrodes $\epsilon_a$ must be increased in the patterning process in order to obtain electrodes $\epsilon_a$, $\epsilon_b$ with equal cross sections if that is desirable, e.g. for obtaining the same conducting capacity if the electrodes $\epsilon_a$, $\epsilon_b$ are made with conducting material with the same conductivity. The planarization can easily take place by any suitable means, e.g. chemomechanical polishing, controlled etching or a controlled micro-abrasive process.

Figure 5B:
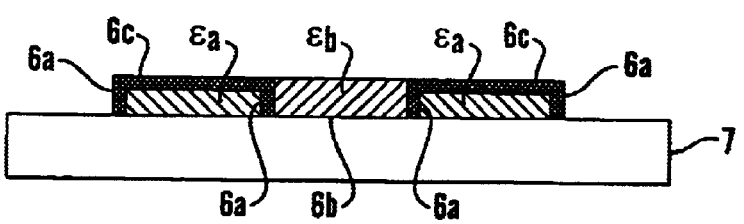

Finally, FIGS. 5a and 5b illustrate process steps deriving either from the process step of either FIG. 2b or FIG. 2c for fabricating a fourth embodiment of the electrode layer L according to the present invention. If the point of departure is FIG. 2b, this implies that if the electrode structures $\epsilon_a$ are made of a conducting material of suitable properties, e.g. metal like titanium or aluminium, they may be selectively oxidized to form the insulating thin film 6 covering the electrodes with edge portions or wall portions 6a and a top surface portion 6c as depicted in FIG. 5a. But the process step shown in FIG. 5a could also start from situation shown in FIG. 2c implying that the insulating thin film 6 must be etched away where it covers the substrate, i.e. in the recess 8, leaving only the electrodes $\epsilon_a$ covered by portions 6a and 6c of the insulating thin film 6. This, however, entails the use of second masking step, which shall increase the process costs. By resorting to a selective oxidation of the electrodes $\epsilon_a$ before depositing the electrical conducting material $\epsilon$ for the electrodes $\epsilon_b$, one obtains a much cheaper way of providing insulating thin film 6 covering the electrodes $\epsilon_a$. Electrical conducting material $\epsilon$ is deposited in the recess 8 between the electrodes $\epsilon_a$ and will then, of course, be insulated therefrom as before by the insulating wall portion 6a, whereafter a planarization step shown in FIG. 5b removes excess conducting materials to form the electrodes $\epsilon_b$ in the recess 8 between the wall portions 6a shown in FIG. 5b and covering an insulating surface of the substrate 7 in direct contact therewith.

This fourth embodiment corresponds to the one illustrated in plan view in FIG. 9a and in cross section on FIG. 9b, wherefrom it can be seen that the electrode $\epsilon_a$ have the height $h_a$ and the electrodes $\epsilon_b$ have the different height $h_b$, whereby the sectional area of the electrodes $\epsilon_a$, $\epsilon_b$ respectively will be $w_a \cdot h_a$ and $w_b \cdot h_b$, implying that in order to form the electrodes $\epsilon_a$, $\epsilon_b$ with the same width $w_a=w_b=w$, the distance d between the electrodes $\epsilon_a$ of the first electrode set $E_a$ has to be adjusted in the patterning step shown in FIG. 2b. As the insulating thin film 6 now also covers the top surface of electrode $\epsilon_b$ with the portion 6c, this of course, implies that the fourth embodiment of the electrode layer L as depicted in FIG. 9a, will be restricted e.g. to yield a capacitive coupling with any contacting material deposited thereabove. The plan view in FIG. 9a of course resembles the embodiment as shown in the plan view in FIG. 6a with the exception that the electrodes $\epsilon_a$ in the former are covered by the insulating thin-film portions 6c.

As already mentioned above the insulating thin film 6 can be deposited by any suitable means, for instance by chemical vapour deposition, spraying or sputtering, but if the electrode material $\epsilon$ and the substrate material are amenable to oxidation, the insulating thin film could be formed by e.g. a thermal oxidation process, resulting in the structure shown in FIG. 2c. This would be applicable for instance with the electrode material deposited as a metallization, using materials like titanium, aluminium, copper etc. as commonly used for electrode materials in electronic devices. If the substrate 7 now for instance is made of silicon, the surface thereof where not covered by electrodes $\epsilon_a$ could be simultaneously oxidized to form an insulating layer of $SiO_2$ thereupon. Also the insulating thin film portions as depicted in FIG. 5a could be formed by a selective oxidation of the electrodes $\epsilon_a$ before the deposition of conducting material $\epsilon$ in the recesses between these electrodes as already mentioned above. Such oxidation processes are well-known to persons skilled in the art and shall not be further discussed here.

FIG. 10a shows in cross section an embodiment of a first electrode layer L1 in the electrode means according to the invention and covered with a global layer of a functional medium provided covering in the electrodes 1 and in contact therewith. FIG. 10b shows the second electrode layer L2 with electrodes provided on a backplane 7' which corresponds to the substrate 7 of the first electrode layer. This electrode layer is of course in all respect similar to the first electrode layer L1 and is joined together with an arrangement comprising the first electrode layer L1 and the global layer of the functional medium to form assembled electrode means EM according to the invention. The resulting embodiment of the latter is shown in cross section in FIG. 10c, but with the first electrode layer L1 now turned 90° and the second electrode layer L2 provided such that the electrodes 2 thereof are oriented crosswise or orthogonal to the electrodes 1 of the electrode layer L1. The resulting structure forms a dense electrode matrix contacting the global layer of a functional medium and with functional elements defined therein where the crossing electrodes 1;2 of respective electrode layers L1;L2 overlap. The layout of the electrode means in the form of an electrode matrix allows matrix-addressing of the functional elements of the global functional medium, for instance by applying voltage to a selected electrode 1 in the first electrode layer L2 and a selected electrode 2 in the second electrode layer. Where these selected electrodes cross an electric field or a potential difference can be applied over the functional medium 3 and inducing a change in a physical parameter thereof in the addressed functional element, e.g. in the form of a change in its impedance. If the functional medium is polarizable ferroelectric or electret material as explained below, the device shown in FIG. 10c can be regarded as a passive matrix-addressable memory and applying voltages to respective electrodes of the first and second electrode layer shall then polarize the functional element 5 formed between crossing electrodes 1,2 which then specifically of course will be a memory cell in a ferroelectric or electret memory. For driving and control in connection with an addressing operation to the memory cells when the functional medium is a memory material, e.g. write and read operations, it is to be understood that electrodes must be connected with peripheral driver and control circuitry as readily understood by persons skilled in the art. FIG. 10d shows how several such devices comprising the electrode means can be stacked to form a plurality of electrode means with a functional medium, thus realizing a volumetric device. It is now easy to see that in a device of this kind each electrode means can be addressed individually in parallel when appropriately connected to a not shown peripheral circuit.

A second embodiment of the electrode means according to the present invention is shown in FIGS. 11a–11d wherein various stages in its manufacture are rendered. FIG. 11a shows an embodiment of a first electrode layer L1 corresponding to the one shown in FIG. 2f and provided on a substrate 7. A global layer of a functional medium 3 is now applied over a first electrode layer L1 and contacting the electrodes thereof. This global layer is planarized and then used as a substrate when a second electrode layer L2 is provided thereabove. The process for doing this mimics the steps shown in FIGS. 2a–f and the resulting electrode layer L2 is not covered with a backplane, but planarized before a second layer of a functional medium 3 is deposited thereabove and forms the substrate for a deposition of a third electrode layer L3. This process can be repeated and it will now be seen how a stacked structure with a plurality of electrode means EM1, EM2 is obtained, as shown in FIG. 11c. However, this volumetric embodiment of a device with electrode means according to the invention is different from the one depicted in FIG. 10d in that the second electrode layer L2 of the first electrode means now forms the first electrode layer L1 of a second electrode means EM2 and so on. The outcome is that in a stacked device with n electrode means EM1–EMn the total number of electrode layers will now not be 2n as is the case when the electrode means in the stacked structure are mutually isolated by substrates or backplanes 7, 7', but n+1. This shall reduce the dimensions (thickness) of the finished structure in a volumetric embodiment of this kind. However, only every second electrode means can be addressed in parallel in this embodiment, for instance the first and the third electrode means and so on due to the fact that the electrode layers from the second to the second last all are capable of connecting to a functional medium layer 3 on either side thereof.

Depositing a second electrode layer L2 directly on a functional medium may pose particular problems when the material of the functional medium for instance is an organic material with a low melting point and the electrodes of the second electrode layer L2 are to be deposited as conductors of an inorganic or a metallic material of one kind or another. For instance when the functional medium is a ferroelectric or electret memory material made of a polymer or copolymer, this material shall have a melting point around 200° C. and a metallization thereof, i.e. providing a metal coating directly on a material of this kind, may lead to a melting of the material in its surface layer thereof. Also a subsequent etching in the patterning step to form the parallel strip-like electrode shall be detrimental to the properties of a material of this kind. However, it has turned out possible to use deposition processes for laying down the metallization layer without inducing damagingly high thermal stresses on say a functional medium in the form of polymer material. Various spraying and sputtering processes, e.g. using electron or ion beams, can be performed in a thermal region compatible with the thermal constraints which must be imposed on the functional medium and when also special care is taken in the patterning step, for instance by using highly selective reactants in an ion reactive process for patterning the metallization layer, a deterioration in the functional properties of the material of the functional medium can be avoided. In other words it will be possible to employ the layer 3 of functional medium as a substrate for a subsequent deposition and patterning of the second electrode layer, even if this involves a metallization and subsequent etching of the layer material used for forming the electrodes of the second layer L2.

In connection with FIGS. 12a, 12b and 12c a discussion shall now be given of an apparatus according to the invention and including the electrode means of the invention. From this discussion it shall then also become apparent how the electrode means according to the invention shall allow the fill factor to approach unity in an apparatus of this kind.

The apparatus according to the invention is shown in plan view in FIG. 12a in an embodiment which is restricted to a passive matrix-addressable device wherein a functional medium is deposited in a global layer 3 and sandwiched between two of the electrode layers L1, L2 forming the electrode means EM according to the invention. The first electrode layer L1 which, depending on the kind of functional material used, could be any of the embodiments shown in FIGS. 6–9, will be identical to the electrode layer L2 which, however, is provided with the parallel strip-like electrodes 2 oriented at an angle and preferably perpendicular to the corresponding electrodes 1 in the electrode layer L1, as shown. Where the electrodes 1,2 overlap, a functional element 5 is defined in the functional medium 3 therebetween. The functional element 5 can be a semiconducting inorganic or organic material or a dielectric material capable of being polarized and exhibiting hysteresis, such as a ferroelectric or an electret material which preferably can be organic, e.g. a polymer or copolymer. In the latter cases the coupling will be capacitive and allow the use of the embodiments of the electrode layer L as shown in cross section in either FIG. 7 or FIG. 9b. The following discussion of an embodiment of the apparatus according to the invention will for brevity's sake be limited to an embodiment of a data storage device and most particularly a ferroelectric data storage device, preferably with a functional medium selected as an organic material in the form of a polymer or copolymer. However, the implementation of the apparatus according to the invention is by no means limited thereto and other possibilities may be obvious to persons skilled in the art. Further, all driver, sensing and control circuitry are for clarity's sake not shown in FIG. 12a, but could in practical embodiments be implemented in CMOS technology based on silicon and provided in the substrate 7 if this is made in the same material. All electrodes 1,2 would then be suitably routed and connected to said circuitry, in manners well understood by persons skilled in the art.

As mentioned, the functional material 3 is sandwiched between the electrode layers L1, L2, as seen to advantage in FIG. 12b which shows a section through the apparatus in FIG. 12a taken along the line X—X. At the overlap or crossings of the electrodes 1,2 a memory cell 5 is defined in the functional medium 3, i.e. ferroelectric material, and this material in a memory cell 5 can from a virgin state be polarized when voltage is applied to the overlapping electrodes 1,2 of respectively the first and second electrode layers L1, L2. The polarization state of the ferroelectric memory material 3 which of course, must be capable of exhibiting hysteresis, can be permanently set for storing a logical value therein and/or the sign (direction) of the polarization, viz. + or − may be switched to the opposite, a phenomenon which may occur in a so-called destructive readout process in order to detect a logic state of the memory cell, i.e. a binary 0 or binary 1. However, a readout may also be non-destructive such that the logic state of the cell remains unaltered after a readout has taken place, for instance by applying voltages to the electrodes 1,2 defining the memory cell 5, but of a magnitude such as not to switch the polarization state thereof. In physical terms the overlap of the electrodes 1;2 of the electrode layers L1, L2 and the ferroelectric material 3 sandwiched therebetween and forming a memory cell 5 can be regarded as a capacitor structure, such that a ferroelectric memory of this kind generally is classified as a kind of capacitive data storage device. As the electrodes $\epsilon_a$, $\epsilon_b$ in the respective electrode layer L1, L2 in any case are only separated by a very thin film 6 of insulating material, the thickness $\delta$ of which being only a tiny fraction of that of the width w of the electrodes $\epsilon_a$, $\epsilon_b$ and corresponding most preferably to a minimum process-constrained or process-definable feature f, it will be seen that an electrode means EM according to the present invention allows an increase in the fill factor towards unity.—It should be noted that the electrodes $\epsilon_a$, $\epsilon_b$ in any case may have different widths $w_a$, $w_b$, but as $w_a$~$w_b$, their widths in practice can be considered having about the same value w.

This will be seen to advantage when one considers a planar section 4 comprising four memory cells $5_1$–$5_4$ as shown in FIG. 12c. The area occupied by the insulating walls 6a between the electrodes are defining the area of the cells $5_1$ . . . $5_4$ and the electrodes themselves in either electrode layers L1, L2 will be $4f^2+8f\delta+4\delta^2$. This implies that with $\delta$ being only a tiny fraction of either f or the width w of the electrodes 1,2, the fill factor approaches unity in the apparatus according to the invention, meaning that close to 100% of the area of functional medium 3 sandwiched between the electrode layers L1, L2 is taken up by the functional elements or cells, the minimum size of which will be $f^2$. For instance, if f~w is set to unity and $\delta$=0.01f, the area of the planar section will be 4+8·0.01+0.0004~4.08 and the fill factor becomes 4/4.08=0.98, i.e. a fill factor of 98%. The maximum number of functional elements or cells 5 in the matrix given that the area of the accessible functional medium is A, will then be close to $A/f^2$ in the apparatus according to the present invention. For instance, if the design rule applied sets f as 0.2 $\mu$m, and a functional medium 3 area A is $10^6$ $\mu$m, then 0.98·$10^6$/$0.2^2$=24.5·$10^6$ addressable functional elements 3 could be provided as memory cells storing one bit, implying a storage density of about 25 Mbit/$mm^2$. Wherein the electrodes as known in the prior art are separated by a distance d defined by the minimum process-constrained feature f, the planar section 4 shown in FIG. 10c shall only contain one cell 5 and the fill factor accordingly be 0.25 or 25%, while the maximum number of cells attainable then of course, will be ¼ of the number that can be achieved when using the electrode means EM according to the present invention.

This also implies that in an apparatus according to the present invention a single device with two electrode layers L1, L2 and the functional medium 3 sandwiched therebetween will have the same capacity as four such devices in conventional technology and stacked to form a volumetric data storage apparatus. However, there is nothing to prevent that the devices such as shown in FIG. 12b can be stacked to yield the volumetric data storage device with a high capacity and high storage density, e.g. with the substrate 7 on the top of electrode layers L2 being provided to function as a separation and/or insulating layer between a first device in the stack and the one following. The outcome is, of course that the same capacity in any case can be achieved with only ¼ of the number of devices embodying the present invention in a stacked volumetric data storage apparatus. The problems inherent in using a large number of stacked devices as will be necessary with conventional technology to obtain the same data storage capacity hence will be avoided.

Particularly the planarization processes that can be applied in the final step for forming the electrode layer can be performed with a very high degree of precision, achieving an overall planarity down to nanometre scale even in large area electrode means according to the present invention. For instance can as mentioned chemomechanical polishing be applied to provide a finished electrode means without the irregularities or bumpiness hampering prior art electrode means provided as direct metallization on a functional material.

Hence it will be impossible to avoid an increasing bumpiness of the stacked device as more devices are stacked. In addition one may also avoid problems due to thermal and mechanical stresses introduced when voltage is applied in order to write and read data to the cells of the functional medium in each separate memory device.

The application of the electrode means EM according to the invention is by no means limited to a data storage apparatus, although an apparatus of this kind would be particularly advantageous whether it is formed of stacked memory devices or not. For the general layout and structure of such apparatuses and a number of possible materials or material combinations for the functional medium, reference can be made to the already mentioned published international patent application WO98/58383 which has been granted both as a U.S. patent and EP patent and belongs to the present applicant. This application discloses architectures for data processing devices, such as memory devices, but are not directed particularly to ferroelectric memory devices. In addition this publication also discloses a similar architecture applied e.g. to information displaying devices.

Concerning the electrode materials for the electrode means EM as used in various devices, such as memory devices, they could as mentioned be any suitable conducting material, e.g. metals like titanium or aluminium which commonly are used in electronic devices. The electrode materials may also be inorganic materials, for instance conducting polymers, but must then be compatible with the process used for forming the insulating thin-film layer or any process used for removing portions thereof.

While it should be understood that the width w of the electrodes of the electrode means EM according to the invention shall correspondingly have a minimum value defined by the minimum process-constrained feature f, it will of course in the first instance only be the width of the electrodes $\epsilon_a$ of the first set which must be deposited and patterned, as well as the distance therebetween that is so restricted. The electrodes $\epsilon_b$ can be deposited by processes which are not restricted by a design rule applying to the patterning process. This implies that a minimum dimensional constraint on the obtainable features could be considerably less than the value of f. The same of course applies to the application of the insulating thin film which can take place e.g. by oxidation, vapor deposition or spraying or sputtering down to almost monoatomic dimensions. The only requirement is that it should provide the necessary electrical insulation between the adjacent electrodes $\epsilon_a$ and $\epsilon_a$ in the respective set $E_a$, $E_b$ of electrodes in the electrode layer L. Also while f in conventional photomicrolithographic processes usually would be in the range of 0.2 $\mu$m or somewhat less, other technologies presently established or under development would allow features in the nanoscale range, i.e. electrode widths down to a few tens of nanometres and for instance the use of chemomechanical processing in the nanoscale range to achieve the necessary planarization, which in any case would yield electrode layers L with a top surface of high planarity and wherein all component parts, i.e. electrodes $\epsilon_a$, $\epsilon_b$ as well as the insulating thin film 6 will be flush in the top surface thereof.

Generally the use of the electrode means according to the invention in an apparatus or device where the functional medium is sandwiched between a pair of electrode layers with the parallel strip-like electrodes and respectively oriented mutually at an angle and preferably perpendicularly so as to form a matrix-addressable device, shall allow a fill factor approaching unity and a maximum number of definable functional elements or cells only constrained by the applicable design rule for the patterning process of the electrodes. Particularly attractive is the possibility of fabricating electrode layers according to the invention in e.g. a reel-to reel process whereafter the separate electrode layers will be obtained by cutting the continuous band of electrodes to desired dimensions. Now a functional medium could be applied to the electrode side of one of electrode layers, whereafter a second electrode layers according to the invention is reoriented with its individual electrodes perpendicular to the electrodes of the first electrode layer and with its electrodes facing and provided in interfacing relationship with the already applied functional medium of the first electrode layer so as to form the electrode means EM according to the invention without having to provide at least the electrodes of the second electrode means in a metallization step directly on the functional medium, a process which as discussed above can be detrimental to the material the functional medium particularly in case of organic materials such as polymers or copolymers used therefore to provide e.g. a ferroelectric matrix-addressable device. The outlined fabrication procedure shall, however, not be easily applicable to active matrix-addressable devices, but in view of recent developments these do now appear as a particularly attractive proposition for say, matrix-addressable ferroelectric memory devices. Not only shall active matrix-addressable ferroelectric memory devices be complicated and have a higher power consumption, but even realized with electrode means according to the present invention, their fill factor will be much less than unity. For instance, in case of active ferroelectric memory cells of the 1T,1C (one transistor, one capacitor) type, the attainable fill factor shall not at best exceed 0.67.

Alternatively the functional medium also could be applied in a final process step after the planarization of the electrode means in a continuous or semi-continuous reel-to-reel operation, either with a carefully controlled thickness or followed by a second planarization. Then separate electrode layers are cut to the desired dimensions, two electrode layers with the functional medium already in situ appropriately oriented with the respective electrodes in mutual perpendicular relationship, whereafter the electrode means according to the invention can be formed and joined with the in situ functional medium of each electrode means in interfacing relationship. This fabrication procedure could be repeated to fabricate for instance a volumetric data storage device comprising a plurality of electrode means according to the invention stacked to any number desired and thus realizing the apparatus according to the invention in a volumetric configuration.

The electrode means according to the invention with its highly planarized electrode layers also allows a careful control of the electrode dimensions, i.e. the cross-section areas of the electrodes which should be uniform with regard to their current-conducting capacity. This in its turn implies that addressing to a functional element in the functional medium shall subject the elements to the same potential differences for inducing or setting the element to a determined impedance (resistive or capacitive) state. Also when write and read protocols with voltages that are fractions of a switching voltage of say, a ferroelectric memory material are used, a higher reliability is obtained, while it also will be possible to careful control quiescent potentials applied to inactive word and bit lines in a passive matrix-addressing scheme, thus avoiding e.g. capacitive couplings and disturbs of unaddressed memory cells in the matrix.

What is claimed is:

1. An electrode means comprising first and second thin-film electrode layers with electrodes in the form of parallel strip-like electrical conductors in each layer, wherein the electrodes of the second electrode layer are oriented crosswise or substantially orthogonally to the electrodes of the first layer, wherein at least one of the electrode layers is provided on an insulating surface of a substrate or backplane, and wherein the electrode layers are provided in parallel spaced-apart planes contacting a globally provided layer of a functional medium therebetween, wherein each of the thin-film electrode layers comprises:

a first set of said strip-like electrodes of width $w_a$ and thickness $h_a$, the electrodes of the first set being mutually spaced apart by distance d equal to or greater than $w_a$; and a second set of said strip-like electrodes with width $w_b$ and thickness $h_b$ provided in the spacings between the electrodes of the first set and electrically insulated therefrom by a thin film of an electrically insulating material with thickness $\delta$ and at least extending along the side edge of the parallel electrodes and forming an insulating wall of thickness $\delta$ therebetween, the magnitude of $\delta$ being small compared to the magnitude of either $w_a$ or $w_b$, with the spacing distance d between the electrodes of the first set being $w_b+2\delta$, and that the electrode layers with electrodes and the insulating thin film respectively form global planar layers in the electrode means.

2. The electrode means according to claim 1, wherein the conducting material of the electrodes of the at least one of the electrode layers is provided directly on the surface of the substrate.

3. The electrode means according to claim 1, wherein the electrodes of one of the electrode layers are exposed to the exterior in the surface thereof opposite the other electrode layer.

4. The electrode means according to claim 1, wherein the surface of one of the electrode layers opposite the other electrode layer is covered by a backplane.

5. The electrode means according to claim 1, wherein the sectional area of the electrodes of both sets is equal, such that $w_a \cdot h_a = w_b \cdot h_b$.

6. The electrode means according to claim 1, wherein the sectional area of the electrodes of the first set is different from that of the electrodes of the second set, such that $w_a \cdot h_a \neq w_b \cdot h_b$.

7. The electrode means according to claim 1, wherein the conducting material of the electrodes of both sets, is the same.

8. The electrode means according to claim 1, wherein the conducting material of the electrodes of the second set is different from the conducting material of the electrodes of the first set.

9. The electrode means according to claim 8, wherein the conducting material of the electrodes of the first set and the conducting material of the electrodes of the second set have conductivities of magnitudes $\sigma_a$, $\sigma_b$ respectively, such that that a relation $$\frac{w_a}{w_b} \div \frac{h_a}{h_b} = \frac{\sigma_b}{\sigma_a}$$

is obeyed, making the conductive capacity of each electrode of the first and second electrode sets respectively, equal in any case.

10. The electrode means according to claim 1, wherein the insulating walls between the electrodes of the first set and the electrodes of the second set form a portion of the insulating thin film provided in a continuous layer covering the electrodes of the first set and in case also a substrate in the spacings between the former, and that the electrodes of the second set are provided in recesses between the wall portions of the insulating thin film and in case also above a portion thereof covering the substrate, the top surface of electrodes of the second set being flush with the surface of a portion of the insulating thin film covering the top surface of the electrodes of the first set, whereby the electrodes of both the first and the second sets have the equal heights $h_a = h_b$, and that the electrode layers with electrodes and the insulating thin film form global planar layers in the electrode means.

11. The electrode means according to claim 1, wherein the insulating walls between the electrodes of the first set and the electrodes of the second set form portions of the thin film of insulating material provided in a layer covering the side edges of the electrodes of the first set up to the top surface thereof and in case also a substrate in the spacings between the former, and that the electrodes of the second set are provided in recesses between the wall portion of the insulating thin film and in case also above portion thereof covering the substrate, the electrodes of the second set being flush with the top edge of the insulating walls as well as the top surface of the electrodes of the first set, whereby the electrodes of the second set have the height $h_b = h_a - \delta$, and that the electrode layer with electrodes and insulating material form a global planar layer of thickness $h_a$ in the electrode means.

12. The electrode means according to claim 1, wherein the insulating walls between the electrodes of the first set and the electrodes of the second set form a portion of the insulating thin film provided in layer covering the electrodes of the first set down to the substrate, that the electrodes of the second set are provided in recesses between the wall portions of the insulating thin film and in case also directly on the exposed substrates and flush with the top surface of a portion of the insulating thin film covering the top surface of the electrodes of the first set, whereby the electrodes of the first set have the height $h_a = h_b - \delta$, and that said at least one electrode layer with electrodes and the insulating thin film form a global planar layer of thickness $h_b$ in the electrode means.

13. A method for manufacturing an electrode layer in electrode means comprising first and second thin-film electrode layers with electrodes in the form of parallel strip-like electrical conductors in each layer, wherein the electrodes of the second electrode layer oriented crosswise or substantially orthogonally to the electrodes of the first layer, wherein at least one of the electrode layers is provided on an insulating surface of a substrate or backplane, and wherein the electrode layers are provided in parallel spaced-apart planes contacting a globally provided layer of a functional medium therebetween, comprising the steps of:

depositing a planar layer of electrical conducting material with a thickness $h_a$ on a substrate;

patterning said planar layer of conducting material to form a first set of said strip-like electrodes with width $w_a$ and thickness $h_a$ mutually spaced apart by recesses therebetween created in the patterning process;

removing portions of the conducting material and exposing the surface of the substrate between the strip-like electrodes of the first set, the parallel electrodes of the first set thus being spaced apart by the distance d being equal to the width of the recesses between said electrodes and equal to or greater than $w_a$;

forming a thin film of electrically insulating material covering at least the side edges of the electrodes of the first set; and depositing an electrical conducting material in the recesses between the insulating thin film covering the side edges of the electrodes of the first set to form a second set of electrodes with a width $w_b$ and thickness $h_b$, such that an electrode layer is obtained as a global planar layer in the electrode means.

14. The method according to claim 13, further including:

forming the insulating thin film as global layer covering both the first set of electrodes and the exposed surface of the substrate;

depositing the conducting material for electrodes of the second set in the recesses between the electrodes of the first set and above the insulating thin film; and planarizing the electrode layer such that the top surface of the electrodes of the second set is flush with the insulating thin film covering the electrodes of the first set.

15. The method to claim 13, further including:

forming the insulating thin film as global layer covering the electrodes of the first set and the exposed surface of the substrate;

depositing the conducting material for electrodes of the second set in the recesses between the electrodes of the first set and above the insulating thin film; and planarizing the electrode layer such that the insulating thin film covering the electrodes of the first set is removed to expose the top surface of said electrodes and such that the top surface of the electrodes of the of both sets and top edges of the insulating thin film all are flush in the top surface of the electrode layer.

16. The method according to claim 13, further including:

forming the insulating thin film as global layer covering both the electrodes of the first set and the exposed surface of the substrate;

removing the insulating thin film at the bottom of the recesses, leaving only the insulating thin film covering the electrodes of the first set down to substrate and exposing the surface thereof;

depositing the conducting material of the electrodes of the second set in said recesses; and planarizing the electrode layer such that the top surface of the electrodes of the second set and the surface of the insulating thin film covering the electrodes of the first set all are flush in the top surface of the electrode layer.

17. The method according to claim 13, wherein only one of the electrode layers is provided on a substrate, the method further including:

depositing a global layer of functional medium covering the one electrode layer provided on a substrate and contacting the electrodes thereof; and then forming a second electrode layer directly on the global layer of a functional medium by similar steps as those used for forming an electrode layer on the substrate.

18. The method according to claim 17, further including providing a substrate or backplane covering the electrode layer formed on the global layer of a functional medium.

19. The method according to claim 13, further including:

selecting the conducting material of the electrodes of the electrode means and/or a substrate material as materials amenable to surface oxidation; and forming the insulating thin film by oxidizing the surface of either in at least one oxidation process as appropriate.

20. The apparatus comprising at least one electrode means comprising first and second thin-film electrode layers with electrodes in the form of parallel strip-like electrical conductors in each layer, wherein the electrodes of the second electrode layer are oriented crosswise or substantially orthogonally to the electrodes of the first layer, wherein at least one of the electrode layers is provided on an insulating surface of a substrate or backplane, and wherein the electrode layers are provided in parallel spaced-apart planes contacting a globally provided layer of a functional medium therebetween, wherein functional elements are formed in volumes of the functional medium defined at respective overlaps between electrodes of the first electrode layer and the electrodes of the second electrode layer to provide a matrix-addressable array, wherein a functional element can be activated by applying a voltage to the crossing electrodes defining the functional element such that a potential is generated across the latter, whereby the physical state of a functional element may be temporarily or permanently changed or a switching between discernible physical states take place, said voltage application essentially corresponding to an addressing of the functional element for write or read operations thereto, and wherein the functional elements according to the properties of a selected functional material can be made to operate as at least one of the following, viz. switchable logic elements of a data processing apparatus, memory cells in a data storage apparatus, or pixels in an information displaying apparatus, whereby the addressing of said elements, cells or pixels in any case takes place in a matrix-addressing scheme, characterized in that the electrodes of the electrode means are provided in a respective electrode layer, that the electrodes in the electrode means all have about the same width w, that electrodes of each means are mutually insulated electrically by an insulating thin film of thickness $\delta$, the magnitude of $\delta$ being a fraction of the width w, and that minimum magnitude of w is comparable to a process-constrained minimum feature size f, whereby the fill factor of functional elements in functional medium relative thereto is close to unity and the number of functional elements approaches a maximum defined by the total area A of the functional medium sandwiched between the electrode layers, and said feature size f, said maximum thus being defined by $A/f^2$.

21. The apparatus according to claim 20, wherein the apparatus comprises a plurality of electrode means provided in stacked arrangement, each of which containing and contacting a respective global layer whereby the apparatus is realized in a volumetric configuration.

22. The apparatus according to claim 21, wherein the electrodes in a second electrode layer of an electrode means contact the functional medium in the following electrode means directly, thus forming a first electrode layer thereof, whereby a stack of n electrode means is realized with a total of n+1 electrode layers.

23. The use of the electrode means according to claim 1 in an apparatus according to claim 16, in order to perform a passive matrix addressing to the functional elements constituting the matrix-addressable array of the apparatus.

24. The use of the electrode means according to claim 1 in the apparatus according to claim 16, wherein each functional element is connected with at least one active switching component, in order to perform an active matrix addressing to the functional elements constituting the matrix-addressable array of the apparatus.

* * * * *

UNITED STATES PATENT AND TRADEMARK OFFICE
CERTIFICATE OF CORRECTION

| | | |
|---|---|---|
| PATENT NO. | : 6,833,593 B2 | Page 1 of 2 |
| APPLICATION NO. | : 10/290524 | |
| DATED | : December 21, 2004 | |
| INVENTOR(S) | : Hans Gude Gudesen et al. | |

It is certified that error appears in the above-identified patent and that said Letters Patent is hereby corrected as shown below:

Column 8

Line 60, change "tion shall be discussed with reference to FIGS. 1-5, illus-" to – tion shall be discussed with reference to FIGS. 2-5, illus- --

Column 9

Line 5, change "The second electrode layer 2 can of course be manufactured" to – The second electrode layer L2 can of course be manufactured --

Line 29, change "subsequent etching. The value of f could then be in the range" to – a subsequent etching. The value of f could then be in the range--

Line 46, change "or alternatively by a combination of suitable process, but" to -- or alternatively by a combination of suitable processes, but --

Line 57, change "tive material ∈ which in any case could be the same as the" to – tive material which in any case could be the same as the –

Column 10

Lines 5-6, "insulating thin film 6. The recess 8a for the process step the illustrating 2e could be regarded as casting mould and" to – insulating thin film 6. The recess 8 for the process in the illustration of 2e could be regarded as casting mould and –

Column 13

Lines 37-54, change " A second embodiment of the electrode means according to the present invention is shown in FIGS. 11a-11d wherein various stages in its manufacture are rendered. FIG. 11a shows an embodiment of a first electrode layer L1 corresponding to the one shown in FIG. 2f and provided on a substrate 7. A global layer of a functional medium 3 is now applied over a first electrode layer L1 and contacting the electrodes thereof. This global layer is planarized and then used as a substrate when a second electrode layer L2 is provided thereabove. The process for doing this mimics the steps shown in FIGS. 2a-f and the resulting electrode L2 layer is not covered with a backplane, but planarized before a second layer of a functional medium 3 is deposited thereabove and forms the substrate for a deposition of a third electrode layer L3. This process can be repeated and it will now be seen how a stacked structure with a plurality of electrode means EM1, EM2 is obtained, as shown in FIG. 11c. However, this volumetric embodiment of a device with" to --
A second embodiment of the electrode means according to the present invention is shown in FIGS. 11a-11d wherein various stages in its manufacture are rendered. FIG. 11a shows an embodiment with a first electrode layer L1 corresponding to the one shown in FIG. 2f and provided on a substrate 7. A global layer 3 of a functional medium is now applied over the first electrode layer L1 and contacting the electrodes thereof. This global layer is planarized and then used as a substrate when

UNITED STATES PATENT AND TRADEMARK OFFICE
CERTIFICATE OF CORRECTION

PATENT NO. : 6,833,593 B2
APPLICATION NO. : 10/290524
DATED : December 21, 2004
INVENTOR(S) : Hans Gude Gudesen et al.

It is certified that error appears in the above-identified patent and that said Letters Patent is hereby corrected as shown below:

a second electrode layer L2 is provided thereabove (as shown in FIGS. 11b-11d). The process for doing this mimics the steps shown in FIGS. 2a-f and the resulting electrode layer L2 is not covered with a backplane, but planarized before a second layer 3 of a functional medium is deposited thereabove and forms the substrate for a deposition of a third electrode layer L3. This process can be repeated and it will now be seen how a stacked structure with a plurality of electrode means EM1, EM2 is obtained, as shown in FIG. 11e. However, this volumetric embodiment of a device with.--

Column 22

Claim 23, line 47, change "in an apparatus according to claim 16, in order to perform a" to -- in an apparatus according to claim 20, in order to perform a --

Claim 24, line 51, change "in the apparatus according to claim 16, wherein each func-" to – in the apparatus according to claim 20, wherein each func- --

Signed and Sealed this

Twenty-ninth Day of August, 2006

JON W. DUDAS
*Director of the United States Patent and Trademark Office*